(12) United States Patent
Oktem et al.

(10) Patent No.: US 7,765,506 B2
(45) Date of Patent: Jul. 27, 2010

(54) METHOD AND APPARATUS FOR AUTOMATED SYNTHESIS OF MULTI-CHANNEL CIRCUITS

(75) Inventors: Levent Oktem, Ankara (TR); Kenneth S. McElvain, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 477 days.

(21) Appl. No.: 11/700,685

(22) Filed: Jan. 30, 2007

(65) Prior Publication Data

US 2007/0174794 A1 Jul. 26, 2007

Related U.S. Application Data

(63) Continuation-in-part of application No. 11/491,437, filed on Jul. 21, 2006, now Pat. No. 7,640,519, which is a continuation of application No. 10/407,678, filed on Apr. 4, 2003, now Pat. No. 7,093,204.

(51) Int. Cl.
*G06F 17/50* (2006.01)
(52) U.S. Cl. .............. 716/11; 716/1; 716/3; 716/4; 716/10; 716/14; 716/16; 716/18
(58) Field of Classification Search ............... 716/1, 716/3, 4, 10, 14, 16, 18
See application file for complete search history.

(56) References Cited

U.S. PATENT DOCUMENTS 4,453,211 A * 6/1984 Askinazi et al. ............ 703/24

5,438,674 A * 8/1995 Keele et al. ............... 711/4
5,745,837 A 4/1998 Fuhrmann
6,055,619 A * 4/2000 North et al. ............... 712/36
6,102,963 A * 8/2000 Agrawal .................... 716/17

(Continued)

FOREIGN PATENT DOCUMENTS

WO  PCT/IL2006/000280    8/2006

(Continued)

OTHER PUBLICATIONS

PCT Notification of Transmittal of the International Search Report and the Written Opinion of the International Searching Authority, or the Declaration, for PCT International Appln No. US2004/010006, mailed Sep. 2, 2005, (17 pages total).

(Continued)

*Primary Examiner*—Helen Rossoshek
(74) *Attorney, Agent, or Firm*—Blakely, Sokoloff, Taylor & Zafman, LLP; Judith A. Szepesi

(57) ABSTRACT

Methods and apparatuses to time-share resources having internal states are described. A first design of a system having a plurality of instances of a logical block to perform logical operations is received. The instances may have internal states. The system is automatically transformed to generate a second design having a fewer quantity of time-shared instances of the logical block. The plurality of the instances in the first design is replaced with the fewer time-shared instances in the second design. The time-shared instances in the second design have elements to time multiplex the internal states.

35 Claims, 36 Drawing Sheets

U.S. PATENT DOCUMENTS

| | | | |
|---|---|---|---|
| 6,216,257 B1* | 4/2001 | Agrawal et al. | 716/16 |
| 6,360,356 B1* | 3/2002 | Eng | 716/18 |
| 6,421,372 B1* | 7/2002 | Bierly et al. | 375/143 |
| 6,888,372 B1* | 5/2005 | Hazanchuk | 326/39 |
| 6,925,628 B2* | 8/2005 | Ogawa et al. | 716/18 |
| 7,051,309 B1* | 5/2006 | Crosetto | 716/10 |
| 7,085,670 B2* | 8/2006 | Odom et al. | 702/127 |
| 7,145,972 B2 | 12/2006 | Kumar et al. | |
| 7,185,293 B1* | 2/2007 | Ofer | 716/1 |
| 7,200,822 B1* | 4/2007 | McElvain | 716/3 |
| 7,356,554 B1* | 4/2008 | Hazanchuk et al. | 708/625 |
| 7,415,692 B1* | 8/2008 | Farrugia et al. | 716/17 |
| 2002/0062472 A1* | 5/2002 | Medlock et al. | 716/1 |
| 2003/0135716 A1 | 7/2003 | Vinitzky | |
| 2004/0044514 A1* | 3/2004 | Granny et al. | 703/23 |
| 2006/0149927 A1 | 7/2006 | Dagan et al. | |
| 2007/0005942 A1 | 1/2007 | Vinitzky et al. | |
| 2009/0046700 A1* | 2/2009 | Glickman et al. | 370/350 |
| 2010/0058278 A1* | 3/2010 | Oktem et al. | 716/18 |

FOREIGN PATENT DOCUMENTS

WO    WO 2006/092792 A2    9/2006

OTHER PUBLICATIONS

James E. Thornton: "Parallel Operation in the Control Data 6600", *AFIPS Proc. FJCC*, pt. 2 vol. 26, pp. 33-40, 1964.

Eran Halperin; Uri Zwick: "Combinatorial Approximation Algorithms for the Maximum Directed Cut Problem", Proceedings of 12th Symposium on Discrete Algorithms, pp. 1-7, 2001.

Keshab K. Parhi: "*VLSI digital signal processing systems: design and implementation*", Wiley-Interscience, pp. 91-118 & 149-187, 1999.

Jhon J. Leon Franco; Miguel A. Melgarejo: "FPGA Implementation of a Serial Organized DA Multichannel FIR Filter", *Tenth ACM International Symposium on Field Programmable Gate Arrays*, Monterey, California, Feb. 24-26, 2002.

Habinc, Sandi "Functional Triple Modular Redundancy (FTMR)" Design and Assessment Report, pp. 1-56. European Space Agency Contract Report, Gaisler Research, Sweden, FPGA-003-01 Version 0.2 Dec. 2002 www.gaisler.com.

Lyons, R.E.; Vanderkulk, W.; "The Use of Triple-Modular Redundancy to Improve Computer Reliability" pp. 200-209. Apr. 1962, IBM Journal.

Weaver, Nicholas; Markovskiy, Yury; Patel, Yatish; Wawrzynek, John; "Post-Placement C-Slow Retiming for the Xilinx Virtex FPGA" 10 pages. Copyright 2003 ACM 1-58113-651—X/03/0002 FPGA , Feb. 23-25, 2003, Monterey, California USA.

Notification to Pay Additional Fees for International Application No. PCT/US2004/010006, mailed Jun. 23, 2005, 8 pages. European Patent Office, Rijswijk. Authorized Officer: Iveta Bujanska.

Shalash, Ahmad F., et al., "Power Efficient Fir Folding Transformation for Wireline Digital Communications", Copyright 1998 IEEE, 0-7803-5148-7/98, pp. 1816-1820.

Sundararajan, Vijay, et al.,"Synthesis of Low Power Folded Programmable Coefficient Fir Digital Filters", Copyright 2000, IEEE, 0-7803-5973-9/00, pp. 153-156.

Lin, John, et al.,"A New Multi-Algorithm Multichannel Cascadable Digital Filter Processor", IEEE 1988 Custom Integrated Circuits Conference, CH2584-1/88/0000-0060. Copyright 1988 IEEE. pp. 10.7.1-10.7.5.

Hassoun, Soha, et al., "Architectural Retiming: Pipelining Latency-Constrained Circuits" Copyright 1996 ACM, Inc. 0-89791-833-9/96/0006, pp. 708-713. $33^{rd}$ Design Automation Conference. XP-002330653.

Parhi, Keshab K., et al,"Synthesis of Control Circuits in Folded Pipeline DSP Architectures", Copyright 1992 IEEE, 0018-9200/92503.00 vol. 27, No. 1, Jan. 1992. pp. 29-43.

Dagan, Eran, "Processor Capable of Multi-threaded Execution of a Plurality of Instruction-sets", U.S. Appl. No. 60/429,014, filed Nov. 26, 2002, 43 pgs.

U.S. Appl. No. 60/429,014, filed Nov. 26, 2002, 48pgs.

* cited by examiner

RECEIVING A FIRST DESIGN OF A SYSTEM HAVING A PLURALITY OF FIRST INSTANCES OF A LOGICAL BLOCK TO PERFORM LOGICAL OPERATIONS WHEREIN THE FIRST INSTANCES HAVE INTERNAL STATES
3601

AUTOMATICALLY TRANSFORMING THE SYSTEM TO GENERATE A SECOND DESIGN HAVING A TIME-SHARED SECOND INSTANCE OF THE LOGICAL BLOCK
3602

METHOD AND APPARATUS FOR AUTOMATED SYNTHESIS OF MULTI-CHANNEL CIRCUITS

This application is a continuation in-part of U.S. patent application Ser. No. 11/491,437, filed on Jul. 21, 2006 now U.S. Pat. No. 7,640,519, which is a continuation of U.S. patent application Ser. No. 10/407,678, filed on Apr. 4, 2003, now issued as U.S. Pat. No. 7,093,204.

FIELD OF THE INVENTION

The invention relates to digital circuits, and more particularly to design of the digital circuits.

BACKGROUND OF THE INVENTION

For the design of digital circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

In designing a circuit, transformations are frequently performed to optimize certain design goals. For example, transformations may be performed to reduce the area used by a circuit. Folding transformation is one of the systematical approaches to reduce the silicon area used by an integrated circuit. By executing multiple algorithm operations on a single function unit, the number of functional units in the implementation can be reduced. More details about folding transformations can be found in "VLSI digital signal processing systems: design and implementation", by Keshab K. Parhi, Wiley-Interscience, 1999.

Time multiplexed resource sharing has been used in the digital circuitry. For example, Peripheral and Control Processors (PACPs) of the CDC 6600 computer, described by J. E. Thornton in "Parallel Operations in the Control Data 6600", AFIPS Proceedings FJCC, Part 2, Vol. 26, 1964, pp. 33-40, share execution hardware by gaining access to common resources in a round-robin fashion. Another example about resource sharing for multi-channel filters can be found in: Jhon J. Leon Franco, Miguel A. Melgarejo, "FPGA Implementation of a Serial Organized DA Multichannel FIR Filter", Tenth ACM International Symposium on Field Programmable Gate Arrays, Monterey, Calif. Feb. 24-26, 2002.

A conventional folding algorithm can be used to automatically generate a design with time-multiplexed resource sharing from a given design. A conventional folding algorithm identifies the multiple algorithm operations that can be time multiplexed to a single functional unit to reduce the number of functional units (e.g., adders, multipliers). However, given a Digital Signal Processing (DSP) design, a conventional folding algorithm spends a significant amount of time in extracting parallelism and dependencies and in optimizing computation schedules. The complexity of hardware synthesis grows super-linearly with the number of logic units involved in the computation. Thus, the larger the designs, the harder it is to optimize and transform the circuitry.

Additionally, the conventional folding algorithm has a limitation that the operations mapped to time-multiplexed shared resources cannot have internal states. That is, the resources having internal states cannot be time shared using the conventional folding algorithm.

SUMMARY OF THE DESCRIPTION

Methods and apparatuses to time-share resources having internal states are described.

A first design of a system having a plurality of instances of a logical block to perform logical operations is received. The instances may have internal states. An output of the logical block depends on an internal state. The internal states of the plurality of the instances may include memory elements. The system may include a single input or multiple inputs. The system is automatically transformed to generate a second design having a fewer quantity of time-shared instances of the logical block. The plurality of the instances in the first design is replaced with the fewer time-shared instances in the second design. The time-shared instances have elements to time multiplex the internal states. These elements may include a cascade of multiple shifting sequential elements.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIG. 36 shows a flowchart of one embodiment of a method to automatically perform folding of a digital processing system;

DETAILED DESCRIPTION

Figure 1:
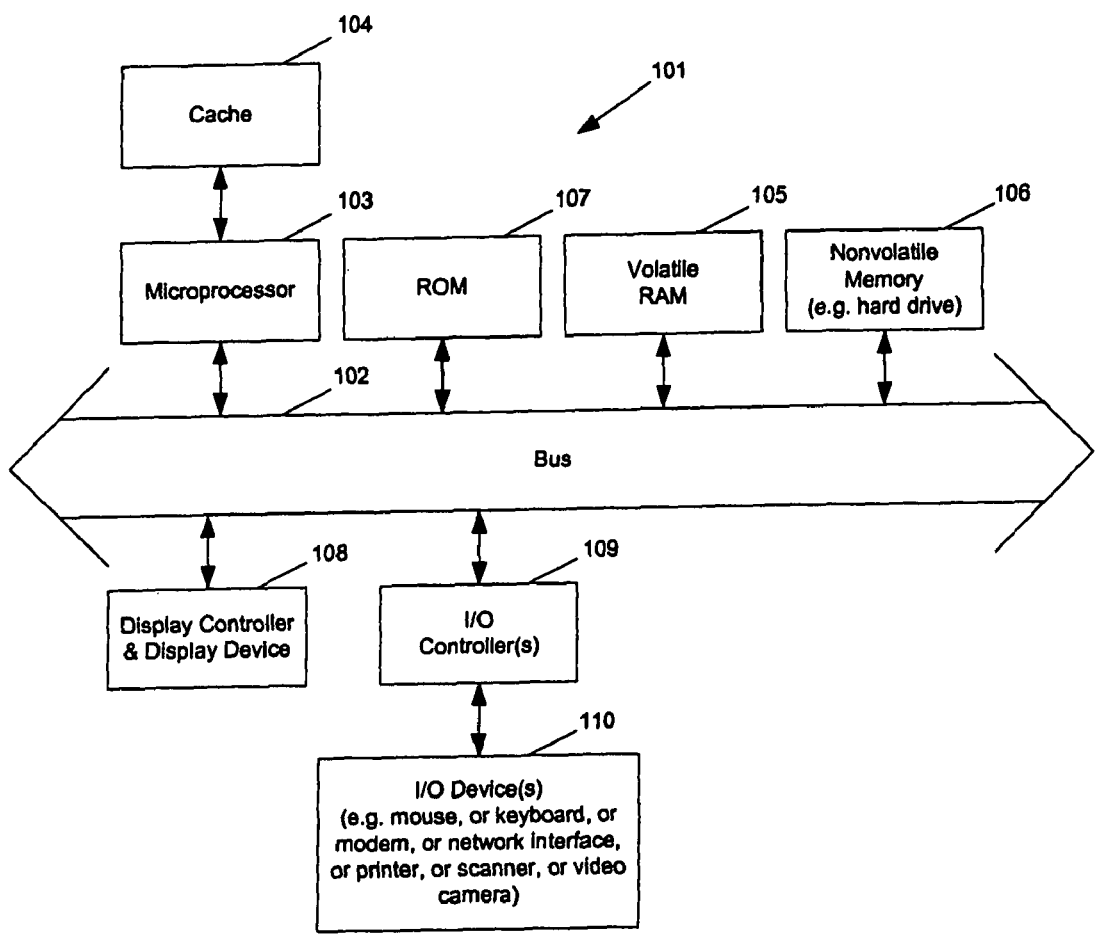
FIG. 1 shows a block diagram example of a data processing system which may be used with the present invention.

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to an or one embodiment in the present disclosure are not necessary to the same embodiment; and, such references mean at least one.

At least one embodiment of the present invention seeks to automatically and efficiently synthesize multi-channel hardware for time-multiplexed resource sharing by automatically generating a time-multiplexed design of multi-channel circuits from the design of a single-channel circuit.

The complexity of hardware synthesis grows super-linearly with the number of logic units involved in the design. A multi-channel circuit typically has independent and identical single channels. An N-channel circuit typically requires N times more logical (computational) units than its single-channel counterpart in optimizing the circuit during hardware synthesis. When a conventional folding transformation is applied on the multi-channel circuit to generate a time multiplexed circuit in order to reduce the function units used, the conventional folding algorithm spends a significant amount of time in extracting parallelism and dependencies and in optimizing computation schedules. Thus, hardware synthesis optimization for time-multiplexed resource sharing is typically computationally intensive, particularly for large designs.

According to one embodiment of the present invention, the synthesis optimization for time-multiplexed resource sharing for multiple channels is based on the design of a single channel. The computation for extracting parallelism and dependencies is avoided; and, a design with time-multiplexed resource sharing can be generated from the design of a single channel without the extensive computation of the conventional folding transformation. In one example, a single-channel design is transformed into a time-multiplexed N-channel design by replacing channel specific elements of the single-channel design (e.g., registers and memories) with their counterparts having N-times more capacity to pipeline the signal processing for multiple channels. More examples and details are described below.

According to another embodiment of the invention, methods and apparatuses to time-share resources having internal states are described. A first design of a system having a plurality of first instances of a logical block, for example, Finite Impulse Response ("FIR") filter block, an Infinite Impulse Response ("IIR") filter, Multiply and Accumulate ("MAC") block, and the like, to perform logical operations is received. The first instances may have one or more internal states, for example, one or more memory elements. An output of the logical block may depend on the one or more internal states. The system is automatically transformed to generate a second design having a time-shared second instance of the logical block. In one embodiment, the system is a single channel system that has a single input and a single output. The plurality of the first instances is replaced with the time-shared second instance having first elements to time multiplex the internal states. The first elements may include a cascade of multiple shifting sequential elements, for example, memory registers.

Many of the methods of the present invention may be performed with a digital processing system, such as a conventional, general-purpose computer system. Special purpose computers, which are designed or programmed to perform only one function, may also be used.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be a Sun workstation, or a personal computer (PC) running a Windows operating system, or an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

Figure 2:
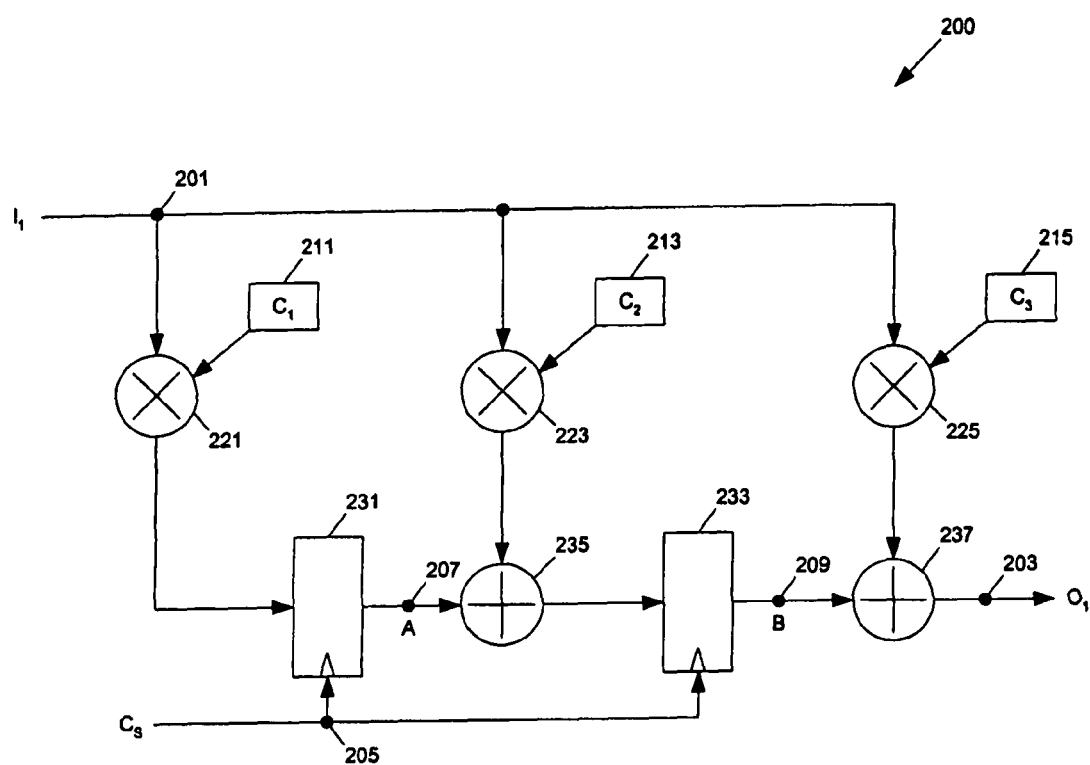
FIG. 2 shows an example of a single-channel three-tap Finite Impulse Response (FIR) filter from which a multi-channel filter can be automatically generated according to one embodiment of the present invention.

FIG. 2 shows an example of a single-channel three-tap Finite Impulse Response (FIR) filter from which a multi-channel filter can be automatically generated according to one embodiment of the present invention. Single-channel circuit 200 receives input on line 201 to generate output on line 203. The single-channel design includes constants 211, 213 and 215, multipliers 221, 223 and 225, adders 235 and 237, and registers (flip-flops) 231 and 233. Input on line 201 is multiplied by multipliers 221, 223 and 225 with constants 211, 213 and 215; and, adders 235 and 237 sum the results to generate output on line 203. Clock signal $C_S$ on line 205 controls the pipelining and the synchronization of the processing in the single-channel circuit.

Figure 3:
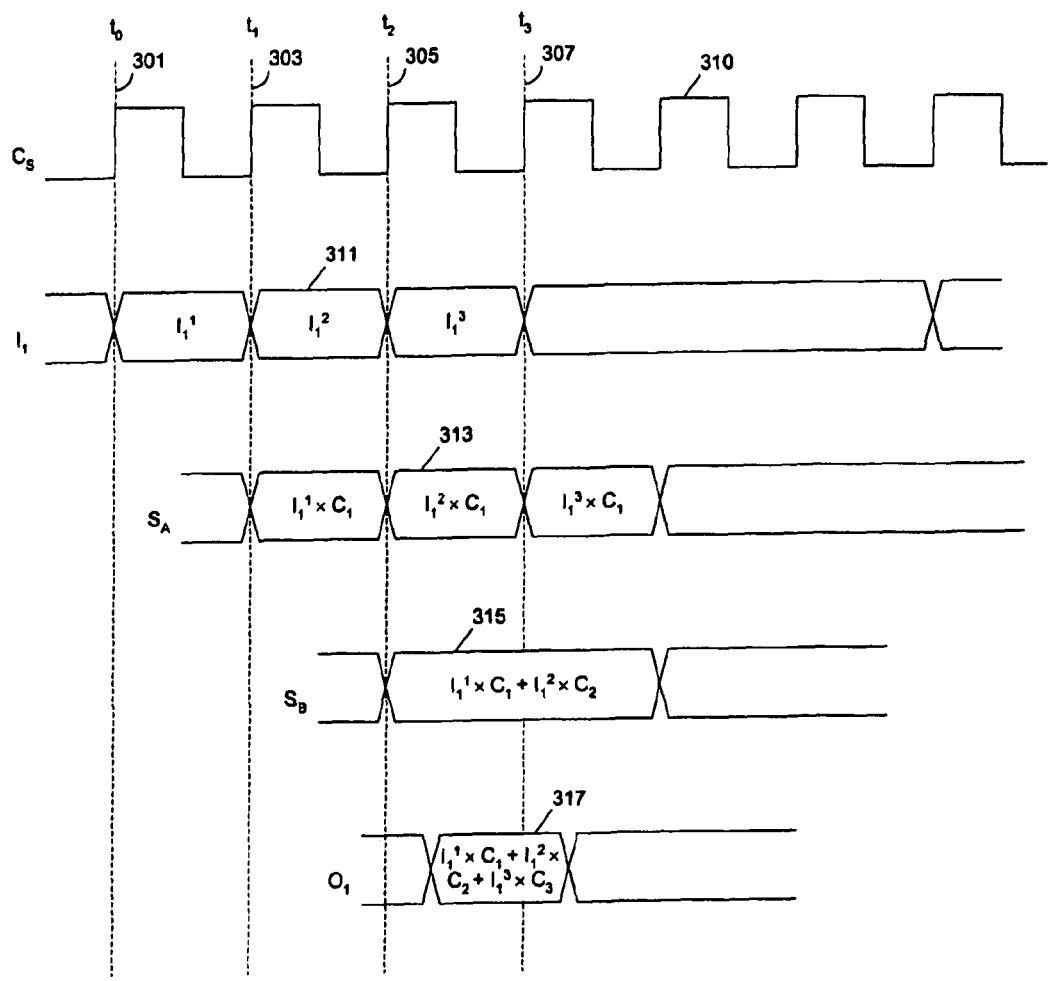
FIG. 3 shows signal waveforms at various locations in the example of FIG. 2.

FIG. 3 shows signal waveforms at various locations in the example of FIG. 2. At time $t_0$ (301), input signal $I_1$ arrives on line 201. At time $t_1$ (303), register 231 outputs the result of multiplier 221 to generate signal $S_A$ 313 on line A 207. At time $t_2$ (305), register 233 outputs the result of adder 235 to generate signal $S_B$ 315 on line B 209, which is the sum of signal $S_A$ 313 and the output of multiplier 223. At time $t_3$, adder 237 sums signal $S_B$ 315 and the output of multiplier 225 to generate signal $O_1$ 317 on output line 203.

Figure 4:
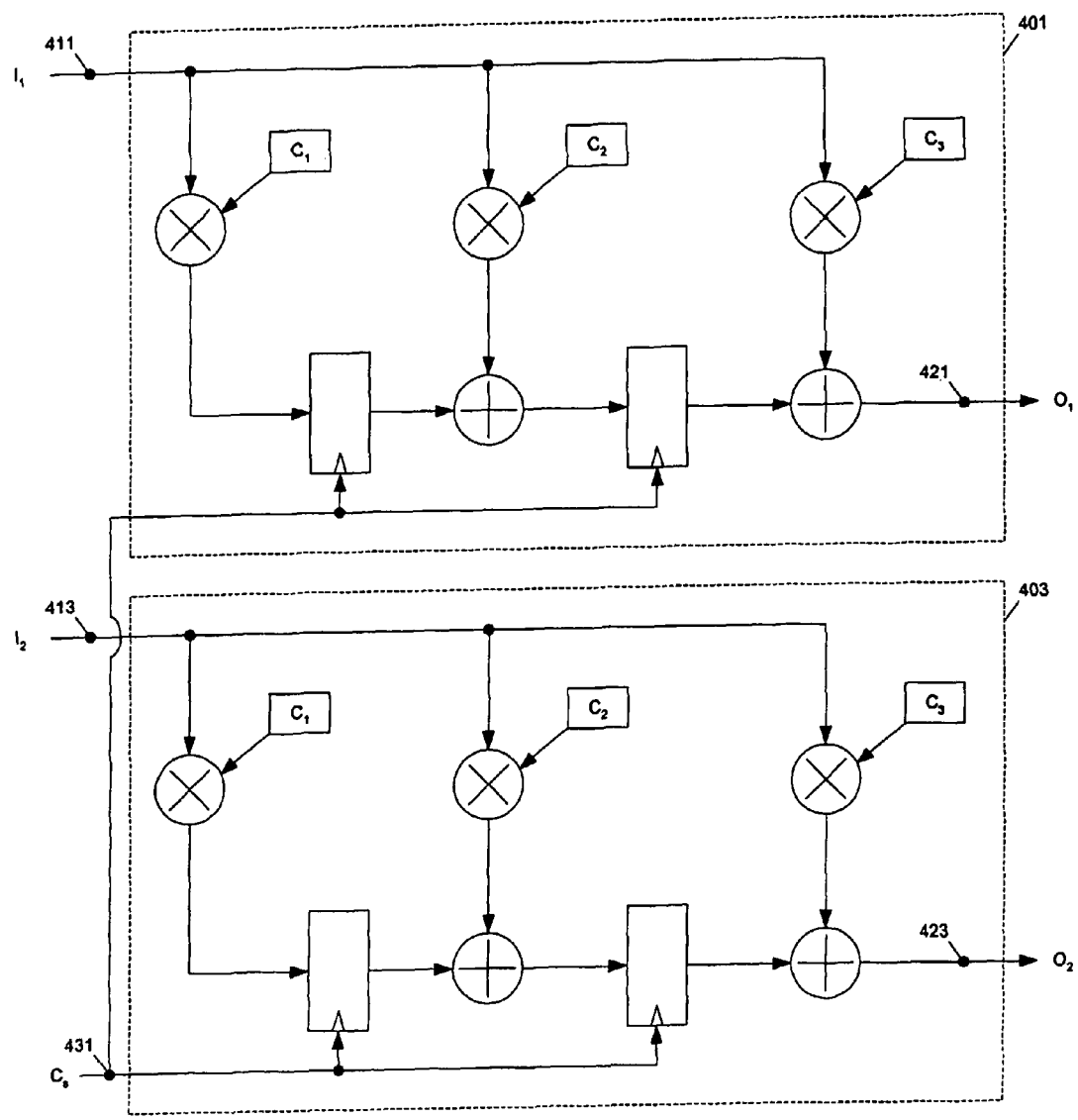
FIG. 4 shows an example of a two-channel filter corresponding to the conglomerate of single-channel filters of FIG. 2.

FIG. 4 shows an example of a two-channel filter corresponding to the conglomerate of single-channel filters of FIG. 2. For example, circuits 401 and 403 have the same elements and structure as circuit 200 in FIG. 2. The conventional solutions for the automatic synthesis of hardware systems do not handle multi-channel systems specially. The conventional methods treat a multi-channel design as a large conglomerate of single-channel systems. A conventional method typically presents the two-channel filter as shown in FIG. 4 without any indication of the inherent high level parallelism in the design. Thus, a hardware synthesis software program performs the computational intensive task of extracting parallelism and dependencies. To generate a design with time-multiplexed resource sharing, a folding transformation may be applied. Thus, the conventional method is computational intensive. Further, when a multi-channel system is interpreted as a conglomerate of single-channel systems, the inherent high level parallelism can be missed, resulting in spending much more computational resources in applying folding transformations and/or failure to sufficiently optimize the given design.

In one embodiment of the present invention, information related to the parallelism in a conglomerate of single-channel systems, which is automatically generated from the single channel design, is also generated to guide a general folding algorithm to apply folding transformation in automatically transforming the a conglomerate of single-channel systems into a time multiplexed circuit. For example, in a typical folding algorithm (e.g., those described in "VLSI digital signal processing systems: design and implementation", by Keshab K. Parhi, Wiley-Interscience, 1999, pp. 149-187, and others), it is a time consuming operation to identify folding sets. A folding set is a set of operations that is to be executed by a same functional unit through time multiplexing. When the conglomerate of single-channel systems is automatically generated from the single channel design, the folding sets can be generate without extensive computation. Such identified folding sets can be used to guide a typical folding algorithm in transforming the conglomerate of single-channel systems (e.g., traditional folding algorithms can be modified to use such information for efficient operations).

Instead of applying folding transformations to a large conglomerate of single-channel systems, at least one embodiment of the present invention explores fully the parallelism in the multi-channel circuits by applying automated transformations on the single-channel design to generate a design that enables time multiplexed resource sharing.

One embodiment of the present invention presumes multi-channel behavior from the beginning to avoid spending time in extracting parallelism and dependencies and in optimizing computation schedules, etc. Taking the single-channel version of the system as the input, it applies a simple mapping to make very effective use of the high level parallelism inherent in the multi-channel system. Since the data flows within the separate threads of the resulting multi-channel design are identical, the resulting control circuitry is minimal.

Figure 5:
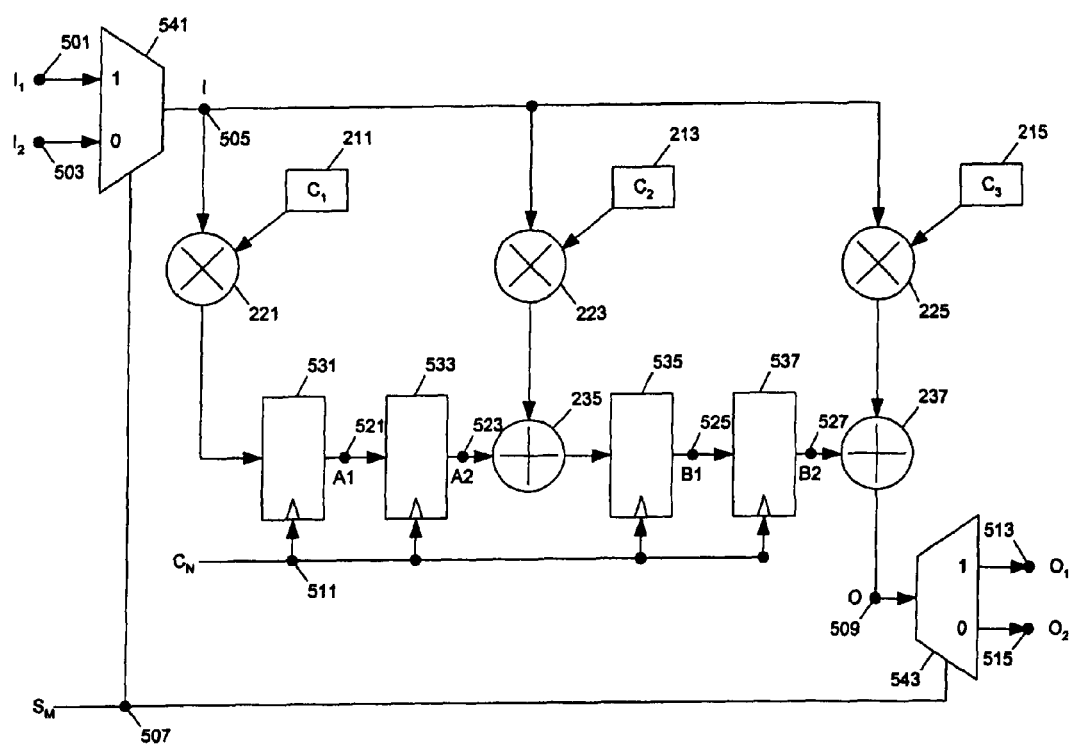
FIG. 5 shows an example of a two-channel filter automatically generated from the single-channel filter of FIG. 2 according to one embodiment of the present invention.

FIG. 5 shows an example of a two-channel filter automatically generated from the single-channel filter of FIG. 2 according to one embodiment of the present invention. Functional units (e.g., multipliers and adders) are not channel specific. Since constants C1, C2, and C3 (211, 213 and 215) are not channel specific, they can also be shared without modification. Registers are in this case channel specific. Thus, registers 231 and 233 of single-channel design 200 are replaced with cascades of 2-shift registers 531, 533 and 535, 537. Inputs 501 and 503 (e.g., corresponding to inputs 411 and 413 of channel 401 and 403 in FIG. 4) are time multiplexed by multiplexer 541 onto input line 505 according to signal $S_M$ (507); and, output 509 is de-multiplexed by de-multiplexer 543 onto lines 513 and 515 (e.g., corresponding to outputs 421 and 423 of channel 401 and 403 in FIG. 4). It is understood that the generation of multiplexer 541 (or de-multiplexer 543) is optional, depending whether or not the multiple-channel receives (or generates) signals on multiple ports.

Figure 6:
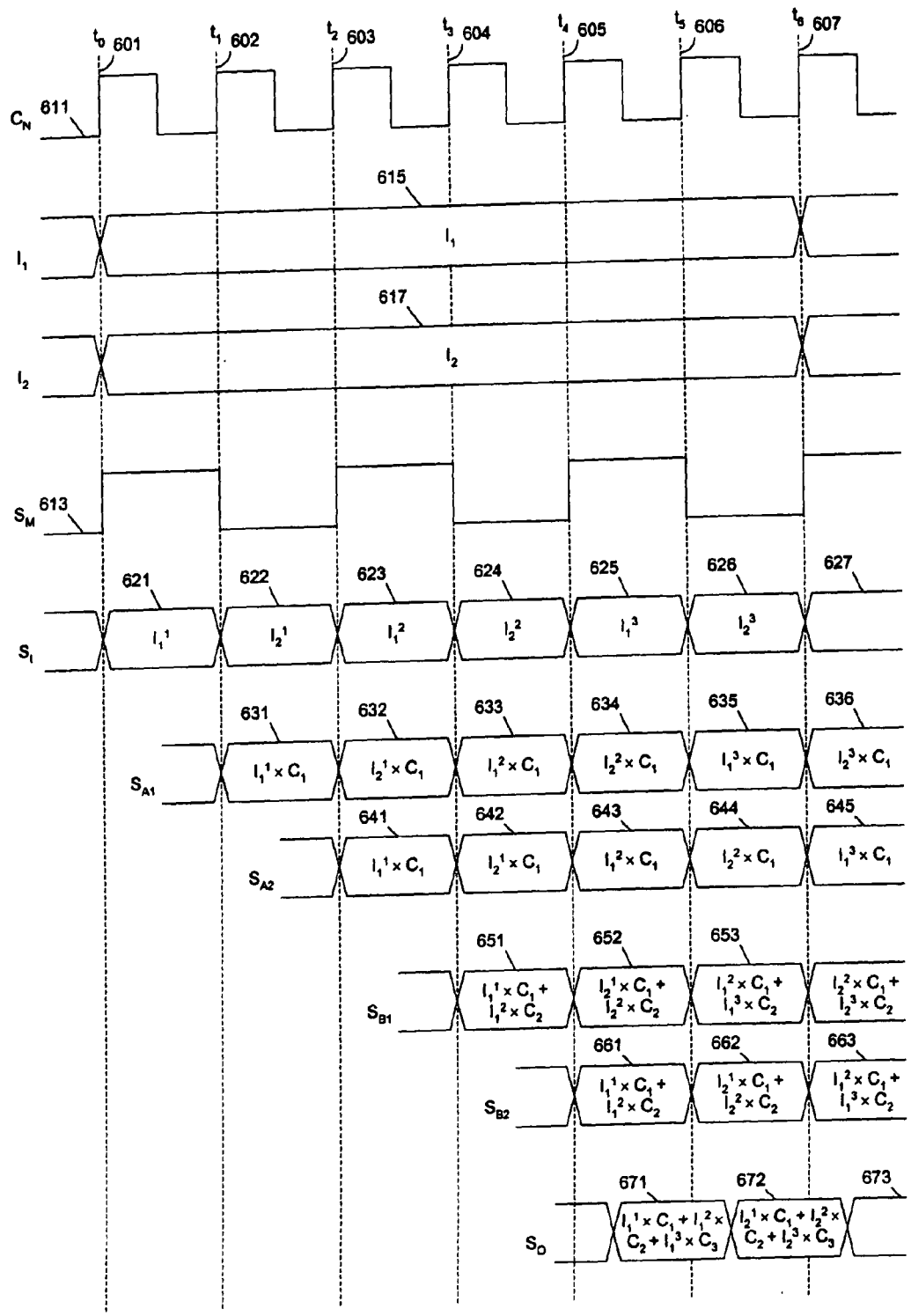
FIG. 6 shows signal waveforms at various locations in the example of FIG. 5.

FIG. 6 shows signal waveforms at various locations in the example of FIG. 5. Input signals $I_1$ (615) and $I_2$ (617) are time multiplexed as signal $S_I$ according to the state of control signal $S_M$ (613). In a typical clock cycle of the single-channel circuit (e.g., from time $t_0$ 301 to $t_1$ 303 in FIG. 3, which correspond to time $t_0$ 601 to $t_2$ 603 in FIG. 6), each input signal is assigned to one time slot (e.g., slot 621 for signal $I_1$ 615 and slot 622 for signal $I_2$ 617). The input signal assigned for a given slot is processed by the logic units and pipelined by the cascades of registers for further processing. For example, signal $I_1$ 615 assigned to slot 621 in $S_I$ is multiplied by constant 211 to generate intermediate result 631 in $S_{A1}$ at time $t_1$ on line A1 (521) from register 531. Intermediate result 631 is delayed by register 533 to output signal 641 in $S_{A2}$ on line A2 (523) at time $t_2$ 603, after which signal $I_1$ 615 is again assigned slot 623 in $S_I$ as input for multiplier 223. At time $t_3$ 604, the result of adder 235 is output from registers 535 to generate on line B1 (525) signal 651 in $S_{B1}$, which is similarly delayed by register 537 to output on line B2 (527) signal 661 in $S_{B2}$ at time $t_4$ 605, after which signal $I_1$ 615 is again assigned slot 625 in $S_I$ as input for multiplier 225. At time $t_5$ 606, signal 671 of $S_O$ on line O (509 in FIG. 5), the result from adder 237 for input signal $I_1$ 615, is ready for output by de-multiplexer 513. Similarly, signal 672 is the result of input signal $I_2$ 617, computed from the input assigned to slots 622, 624 and 626. Further, the intermediate results from previous inputs are pipelined in the system so that results based on the previous inputs are available in the intermediate next clock cycles (e.g., results based on samples 623, 625 and 627 of input $I_1$ is available at time slot 673).

Thus, FIGS. 5 and 6 illustrate that, when a register in the single-channel design is replaced by a cascade of registers, the intermediate result stored in the register of the single-channel design is pipelined in the cascade of registers in the multi-channel design so that the output the cascade of registers is synchronized with the time slot assignment for the signal processing in the multi-channel circuit. In one embodiment of the present invention, each of the channel-specific sequential elements (e.g., registers, flip-flops, memory elements) in the single-channel design is replaced with corresponding elements of N-times more capacity (e.g., a cascade of registers or flip-flops, dual-port RAM addressed according to the time slot assignment, RAM-shift register combo, and others).

Figure 7:
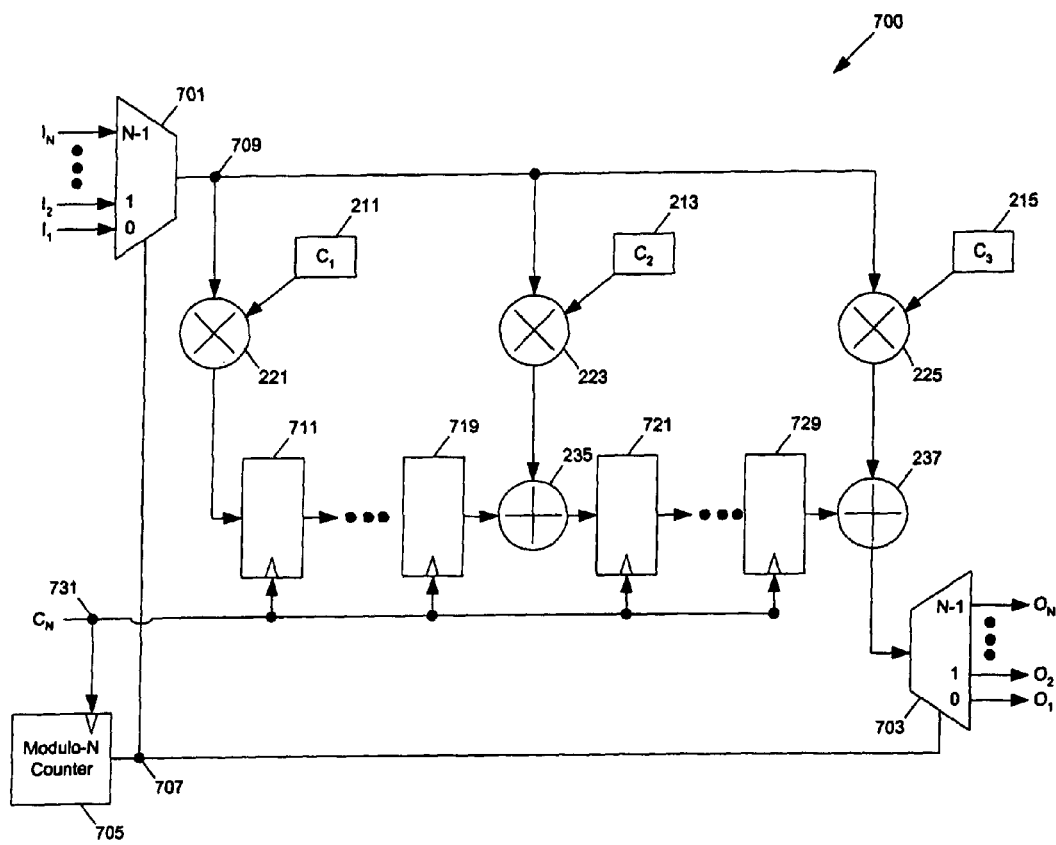
FIG. 7 shows an example of a multi-channel filter automatically generated from the single-channel filter of FIG. 2 according to one embodiment of the present invention.

FIG. 7 shows an example of a multi-channel filter automatically generated from the single-channel filter of FIG. 2 according to one embodiment of the present invention. To automatically convert single-channel design 200 of FIG. 2 into time multiplexed N-channel design 700 of FIG. 7, register 231 of FIG. 2 is replaced with a cascade of N-shift registers 711-719; and, register 233 of FIG. 2 is replaced with a cascade of N-shift registers 721-729. Modulo-N counter 705 is used to generate a signal for controlling the time slot assignment for input signals. When the output of modulo-N counter 705 on line 707 is i (i=0, 1, ..., N−1), multiplexer 701 selects signal $I_{i+1}$ as the input signal to line 709. Similarly, the output signal from adder 237 in FIG. 7 is decoded by de-multiplexer 703 to generate output signals for corresponding channels according to the output of modulo-N counter 705.

Figure 8:
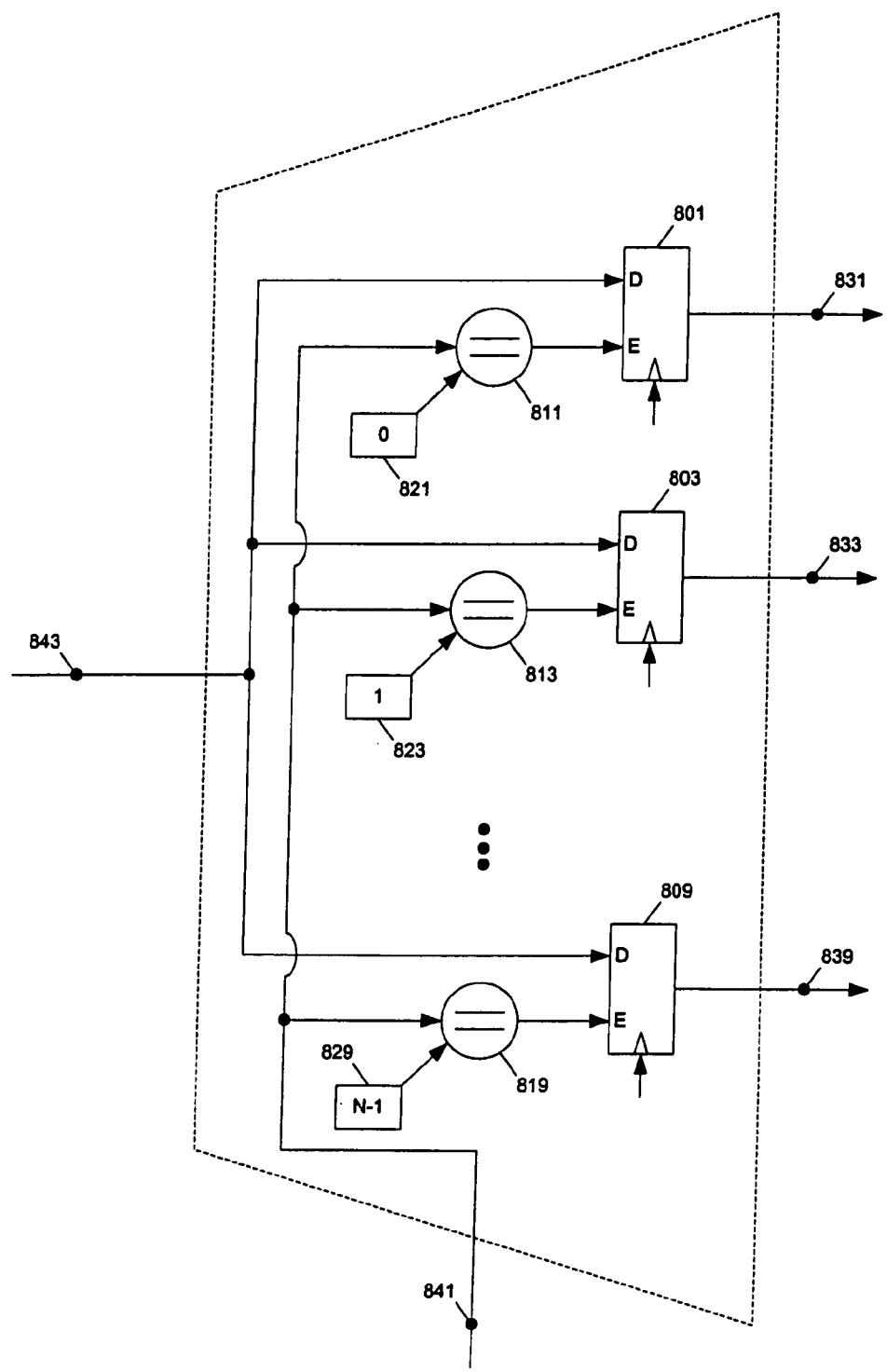
FIG. 8 shows an example of an output decoder and latch circuit for de-multiplexing outputs from a multi-channel filter according to one embodiment of the present invention.

FIG. 8 shows an example of an output decoder and latch circuit for de-multiplexing outputs from a multi-channel filter according to one embodiment of the present invention. Testers 811, 813, ..., 819 control latches 801, 803, ..., 809 according to the state of selection signal 841 (e.g., from modulo-N counter 705 of FIG. 7). The signal on line 843 (e.g., the output of adder 237 of FIG. 7) is latched on one of output lines 831, 833, . . . , 839, when the state of the selection signal matches the corresponding one of the constants (821-829) for the testers (811-819).

Figure 9:
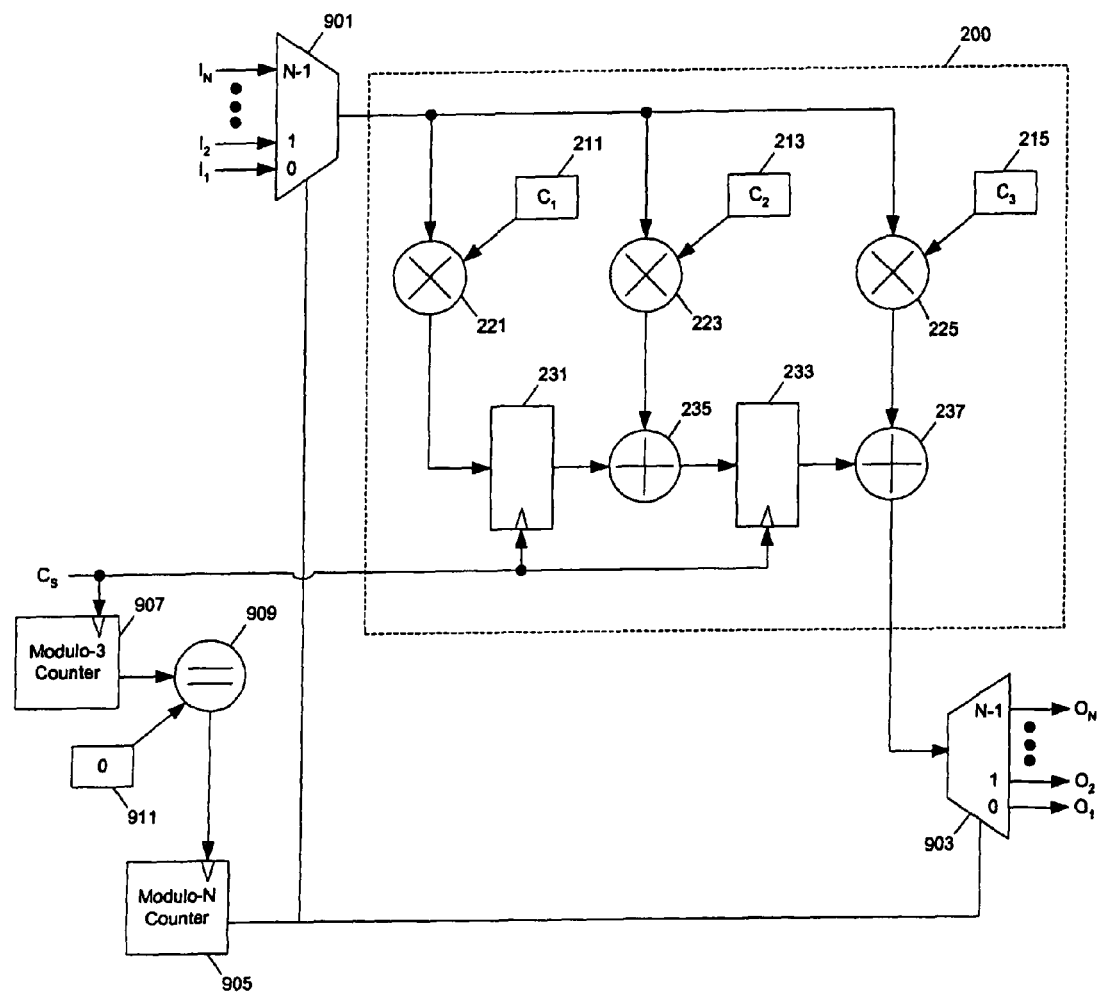
FIG. 9 shows another example of a multi-channel filter automatically generated from the single-channel filter of FIG. 2 according to an alternative embodiment of the present invention.

FIG. 9 shows another example of a multi-channel filter automatically generated from the single-channel filter of FIG. 2 according to an alternative embodiment of the present invention. In FIG. 9, circuit 200 is accessed in a round-robin fashion to process each of the input signals. Modulo-3 counter 907 allows input signals for each of the channels to be completely processed to generate an output signal before the channel is used for the processing of the signals of the next channel. Modulo-N counter 905 selects the signals of the channel to be processed by circuit 200. Although the method of FIG. 9 makes fewer modifications to the single-channel circuit in generating the multi-channel design, the circuit of FIG. 9 has a smaller throughput than the circuit of FIG. 7. The signal pipelining in the single-channel design is not fully utilized in FIG. 9 because of the round-robin scheme. Depending on the structure of the input and output signals, the latency for the processing of signals for each channel may be minimized when a multi-channel design of FIG. 9 is used. However, it is understood that, in general, the input signals for different channels do not arrive in a round-robin fashion; instead, the input signals for different channels arrive at the same time. To retiming the input signals so that the input signals arrive in a round-robin fashion, a buffer can be used between the input signal and multiplexer 901. Such a buffer samples input signals at the same time, but delays the input signals from different channels for different amount of time so that the sampled signals arrived at multiplexer 901 in a round-robin fashion.

It is noticed that the time-multiplexed multi-channel of FIG. 7 can be used directly to replace the conglomerate of single-channel systems (e.g., in FIG. 4) when the frequency of the clock signal $C_N$ (741) is N times the frequency of the clock signal of the single-channel systems (e.g., clock signal $C_S$ 431 of FIG. 4). When a design of FIG. 9 is used, an additional circuitry (e.g., a block of RAM with addressed according to the timing of the input signals and the time slot assignment for processing) can be used to retime the inputs.

In one embodiment of the present invention, each of the channel-specific elements (e.g., registers, constants, ROM or RAM) of the single-channel design is replaced with corresponding elements to pipeline the processing for multi-channel inputs. Although each of the registers (or flip-flops) can be considered a channel-specific register, which is replaced with a cascade of shifting registers, pipeline registers can be identified as non-channel-specific registers. When the pipeline registers are not replaced with cascade of shifting registers, the timing within the time-multiplexed shared channel can still be synchronized with respect to the input of the channels.

A set of pipeline registers is a feed-forward cutset of the system graph. As a feed-forward cutset of the system, the removal of the set of pipeline registers partitions the system into two disconnected subsystems, with a unidirectional flow of data between the two subsystems. However, when there are multiple inputs and/or multiple outputs in the system, the cutset that partitions the inputs into different subsystems or the outputs into different subsystems does not qualify as a set of pipeline registers, since synchronization can be distorted if such a cutset is not pipelined in generating the multi-channel design.

Feed-forward cutsets can be automatically identified using various algorithms known in the art. For example, Eran Halperin and Uri Zwick described methods in "Combinatorial approximation algorithms for the maximum directed cut problem", Proceedings of 12th Symposium on Discrete Algorithms, pp. 1-7, 2001, which can be used to determine the feed-forward cutsets. It is noticed that feed-forward cutsets are often referred to as "directed cuts" (or "dicuts") in graph theory literature. The methods of Eran Halperin and Uri Zwick for finding "maximum directed cuts" can be used to find the feed-forward cutsets containing maximum numbers of registers.

Figure 10:
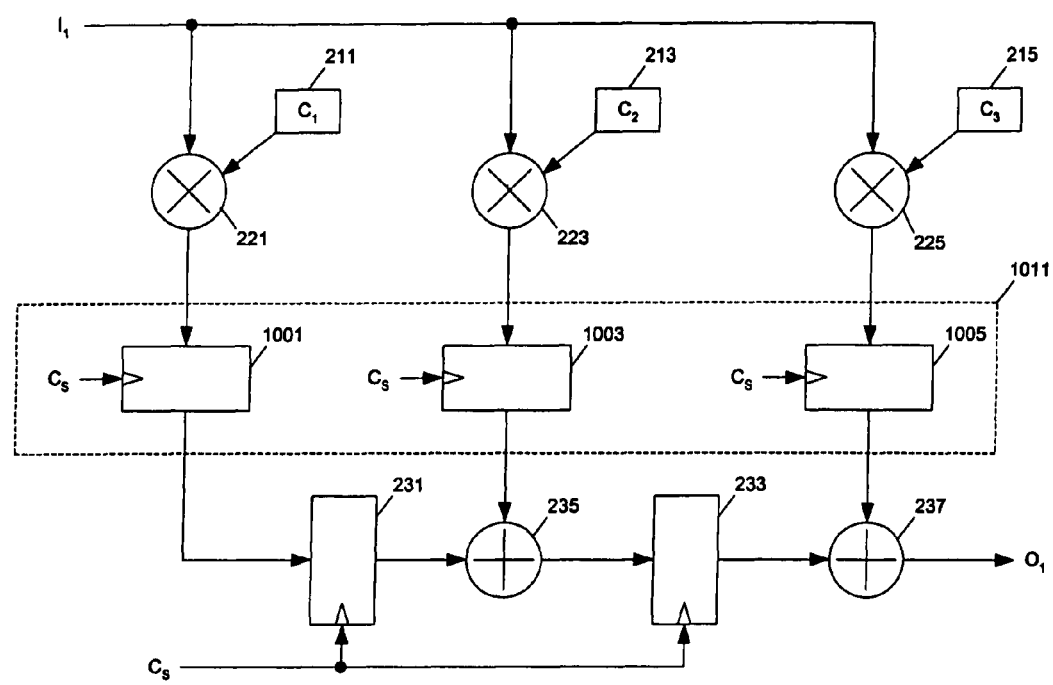
FIG. 10 shows an example of a single-channel three-tap Finite Impulse Response (FIR) filter with pipeline registers from which a multi-channel filter can be automatically generated according to one embodiment of the present invention.

FIG. 10 shows an example of a single-channel three-tap Finite Impulse Response (FIR) filter with pipeline registers from which a multi-channel filter can be automatically generated according to one embodiment of the present invention. The design of FIG. 10 includes pipeline registers 1001-1005. Feed-forward cutset 1011 partitions the system of FIG. 10 into two subsystems with a unidirectional flow of data between the two subsystems. Thus, registers 1001-1005 are identified as non-channel-specific; and thus, the channel-specific elements in the design of FIG. 10 are registers 231 and 233. Channel specific registers 231 and 233 in FIG. 10 are replaced with cascades of registers to generate time-multiplexed resource shared design of FIG. 11.

Figure 11:
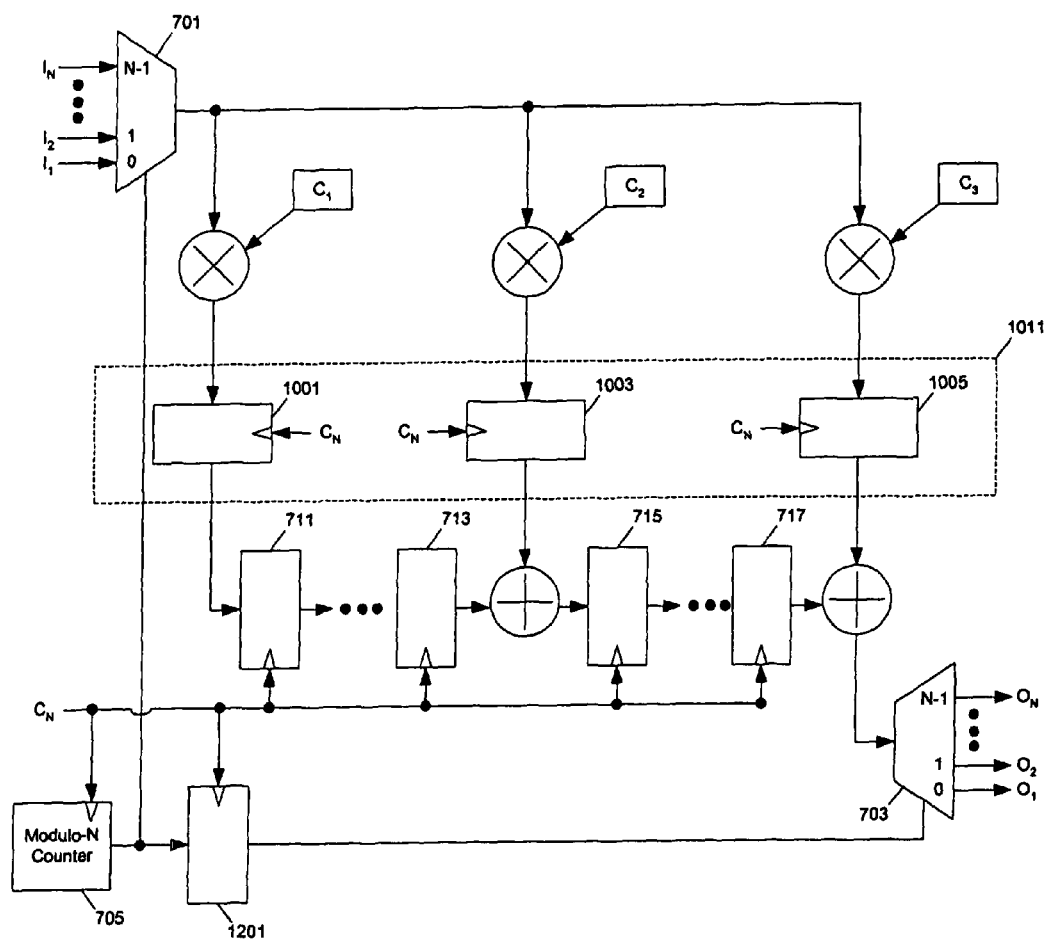
FIG. 11 shows an example of a multi-channel filter automatically generated from the single-channel filter of FIG. 10 according to one embodiment of the present invention.

FIG. 11 shows an example of a multi-channel filter automatically generated from the single-channel filter of FIG. 10 according to one embodiment of the present invention. In FIG. 11, pipeline registers 1011 remain unchanged. To synchronize the operation of the de-multiplexer 703 with the state of Modulo-N counter 705, register 1201 is inserted to delay the output of counter 705 for one cycle to offset the effect of the delay caused by cutset 1011. In general, when M sets of pipeline registers are identified as non-channel specific elements, the output of the Modulo-N counter is delayed mod(M, N) cycles to synchronized the operations of multiplexer and de-multiplexer (e.g., 701 and 703 in FIG. 11). It is also notice that registers 231, 1003 and 1005 in FIG. 10 can be identified as a set of pipeline registers, in which case registers 1001 and 233 will be replaced with cascades of shifting registers. Alternatively, if none of the registers in FIG. 10 is identified as pipeline registers, all registers in FIG. 10 are replaced with cascades of registers, in which case the resulting design will have N sets of pipeline registers and no register is necessary to delay the output of modulo-N counter 705, since mod(N,N)=0.

A channel-specific register of the single-channel system can be replaced with a cascade of N-shift registers in generating the multi-channel system. In some FPGA architectures (such as Xilinx Virtex), shift registers are natural primitives. This enables very efficient memory usage when the target architecture is one of these FPGA architectures. It is understand that each of the channel-specific registers can be also be replaced by other memory structures (e.g., an N-item dual-port RAM, or a RAM-shift register combo, or others) that can pipeline the intermediate results according to the state of the module-N counter.

Figure 12:
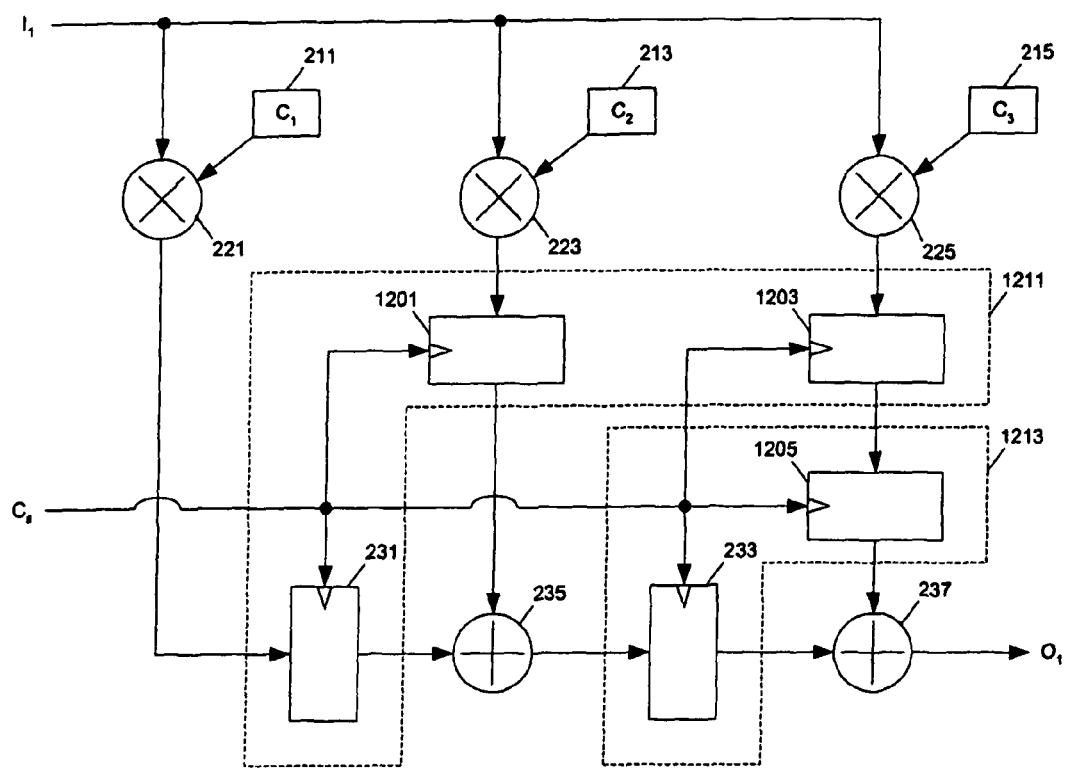
FIG. 12 shows another example of a single-channel circuit with pipeline registers from which a multi-channel filter can be automatically generated according to one embodiment of the present invention.

FIG. 12 shows another example of a single-channel circuit with pipeline registers from which a multi-channel filter can be automatically generated according to one embodiment of the present invention. The design of FIG. 12 contains feed-forward cutsets 1211 and 1213, including registers 1201, 1203, 231 and 1205, 233. Thus, all registers in FIG. 12 can be identified as non-channel specific; and, no register is replaced with a cascade of registers in generating the design of FIG. 13.

Figure 13:
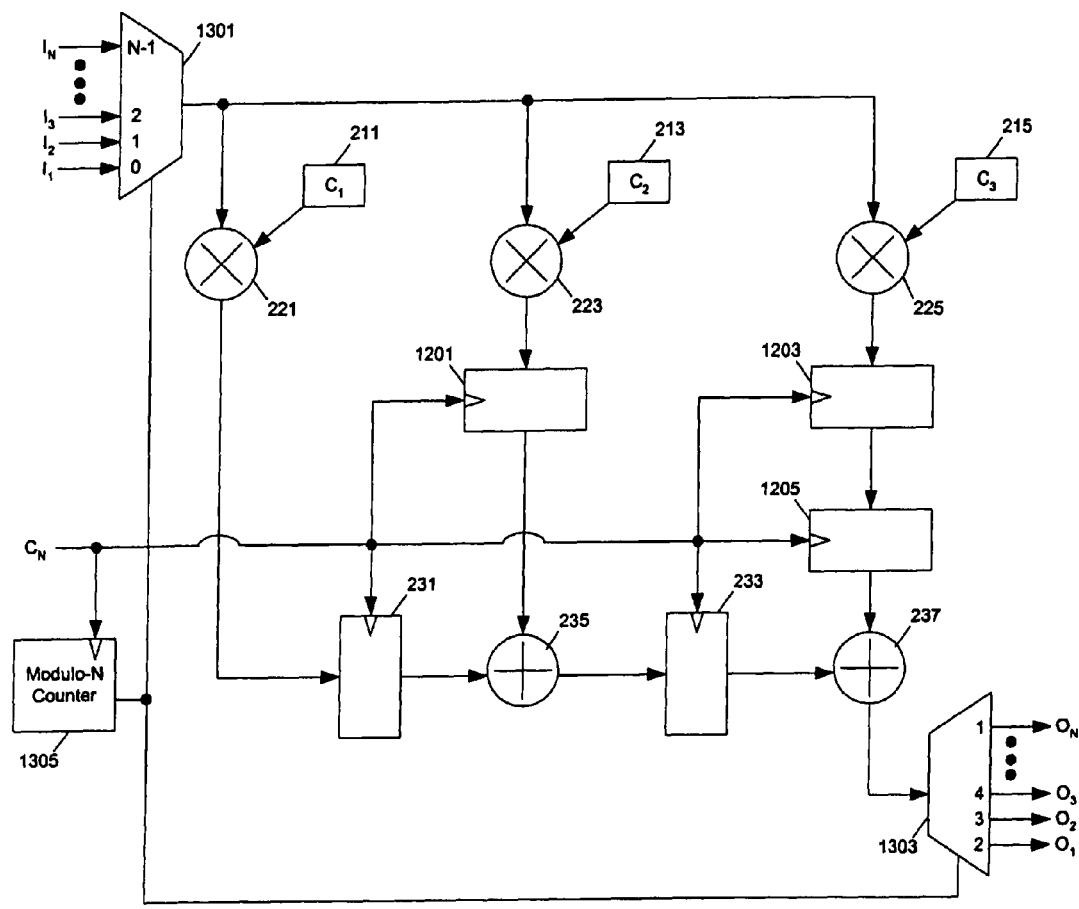
FIG. 13 shows an example of a multi-channel filter automatically generated from the single-channel filter of FIG. 12 according to one embodiment of the present invention.

FIG. 13 shows an example of a multi-channel filter automatically generated from the single-channel design of FIG. 12 according to one embodiment of the present invention. Since there are two sets of pipeline registers between multiplexer 1301 and de-multiplexer 1303, two cycles of delay can be used to synchronize the operations of the multi-channel filter. The design of FIG. 13 rotates the constants of de-multiplexer 1303 for two shifts to compensate the delay caused by the two sets of pipeline registers. Thus, when modulo-N counter outputs i (i=0, 1, ..., N−1), multiplexer 1301 selects signal $I_{i+1}$ as the input while de-multiplexer 1303 outputs for $O_{mod(i-1,N)}$.

From the above examples, it will be apparent to one skilled in the art that different methods (e.g., inserting delay elements, shifting constants for the de-multiplexer, generating different selection signals, or combination of these) can be used to compensate the delays caused by the sets of pipeline registers that remain unchanged in the time-shared design. Further, in general, a Finite State Machine (FSM) (e.g., a modulo-N counter) can be used to control the time multiplexing of the input signals, as well as the resource sharing in the design.

Although the above examples are illustrated using a single-channel design with a single input and a single output, from this description, it will be apparent to one skilled in the art that methods of various embodiments of the present invention can also be applied to a single-channel design with multiple inputs and multiple outputs. Further, an M-channel design (M>1) can be treated as a single-channel design to automatically generate an N×M-channel design with resource sharing.

In one embodiment of the present invention, the single-channel design is optimized before and/or after the automatic transformation in generating the resource shared design for multiple channels using conventional methods (e.g., folding transformation, and others).

Figure 14:
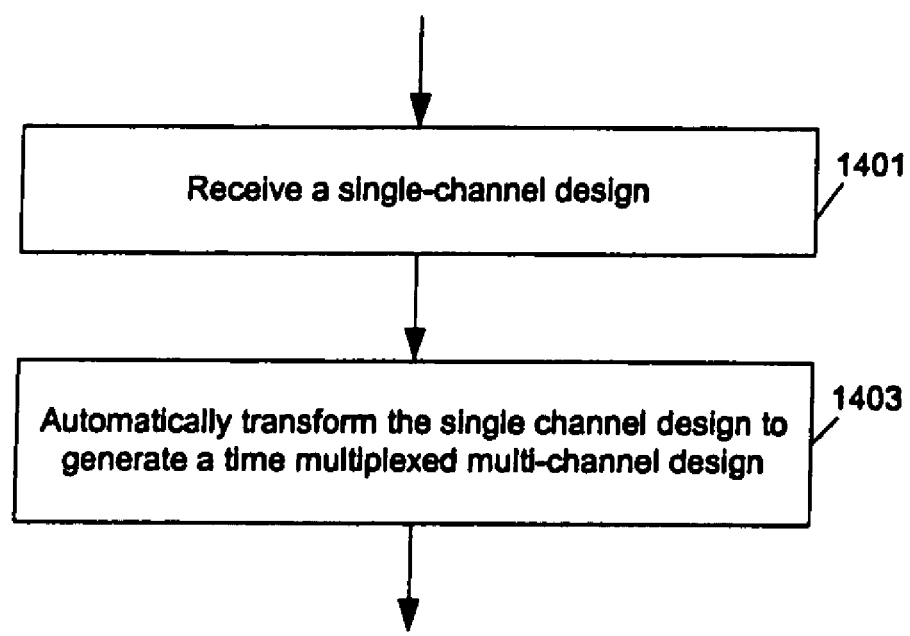
FIG. 14 shows a flow chart of a method to generate a multi-channel circuit from a single-channel circuit according to one embodiment of the present invention.

FIG. 14 shows a flow chart of a method to generate a multi-channel circuit from a single-channel circuit according to one embodiment of the present invention. After a single-channel design is received in operation 1401, operation 1403 automatically transforms the single-channel design to generate a time multiplexed multi-channel design. Since the transformation is based on a single-channel design, which has fewer logical elements than a conglomerate of single-channel systems, computational intensive operations of extracting high level parallelism are avoided.

Figure 15:
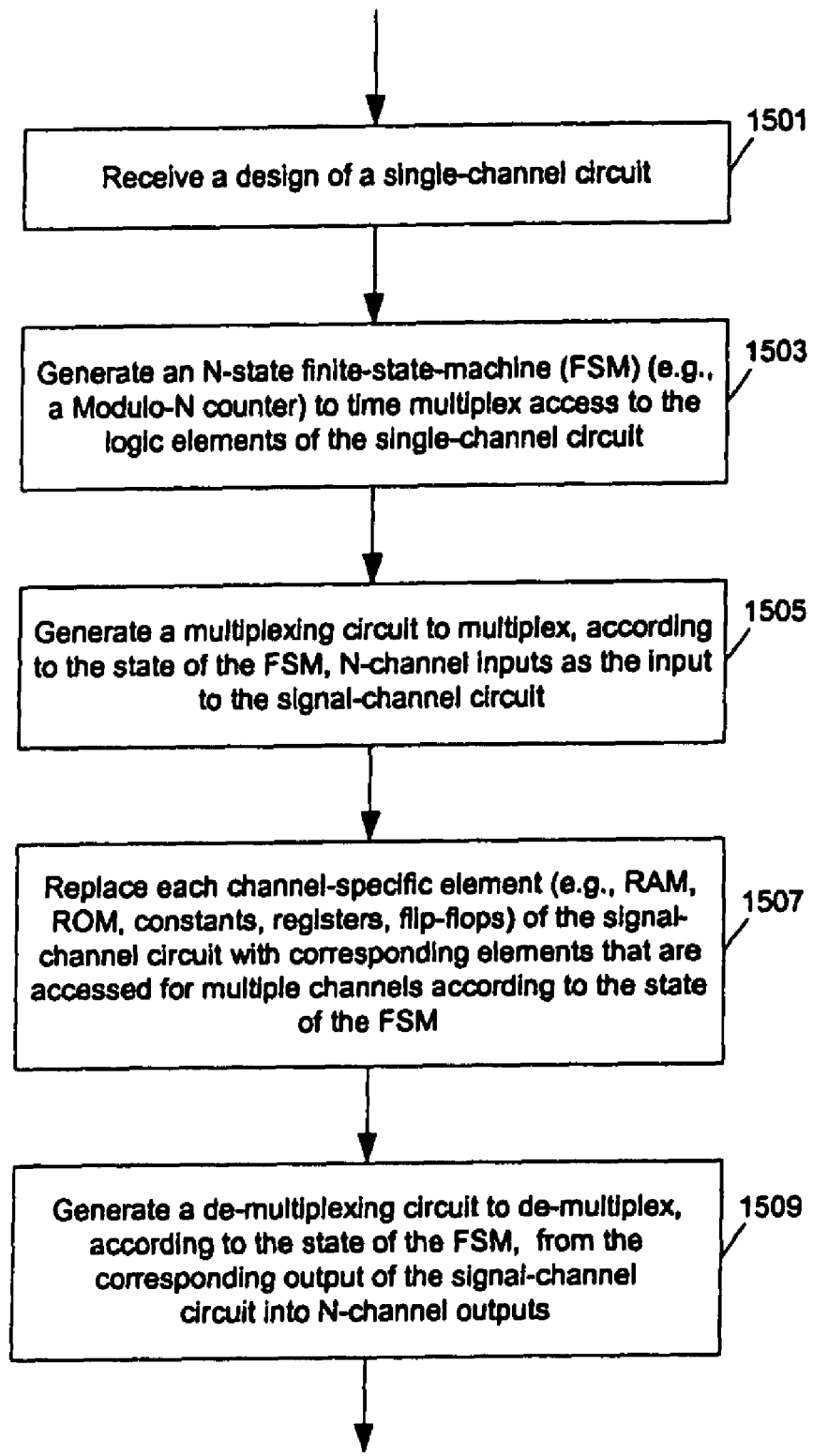
FIG. 15 shows a detailed flow chart of a method to generate a multi-channel circuit from a single-channel circuit according to one embodiment of the present invention.

FIG. 15 shows a detailed flow chart of a method to generate a multi-channel circuit from a single-channel circuit according to one embodiment of the present invention. Operation 1501 receives a design of a single-channel circuit. Operation 1503 generates an N-state finite-state-machine (FSM) (e.g., a Modulo-N counter) to time multiplex access to the logic elements of the single-channel circuit. Operation 1505 generates a multiplexing circuit to multiplex, according to the state of the FSM, N-channel inputs as the input to the single-channel circuit. Operation 1507 replaces each channel-specific element (e.g., RAM, ROM, constants, registers, flip-flops) of the single-channel circuit with corresponding elements that are accessed for multiple channels according to the state of the FSM. Operation 1509 generates a de-multiplexing circuit to de-multiplex, according to the state of the FSM, from the corresponding output of the single-channel circuit into N-channel outputs. After the above transformation, a multi-channel design is generated from the single-channel design.

Figure 16:
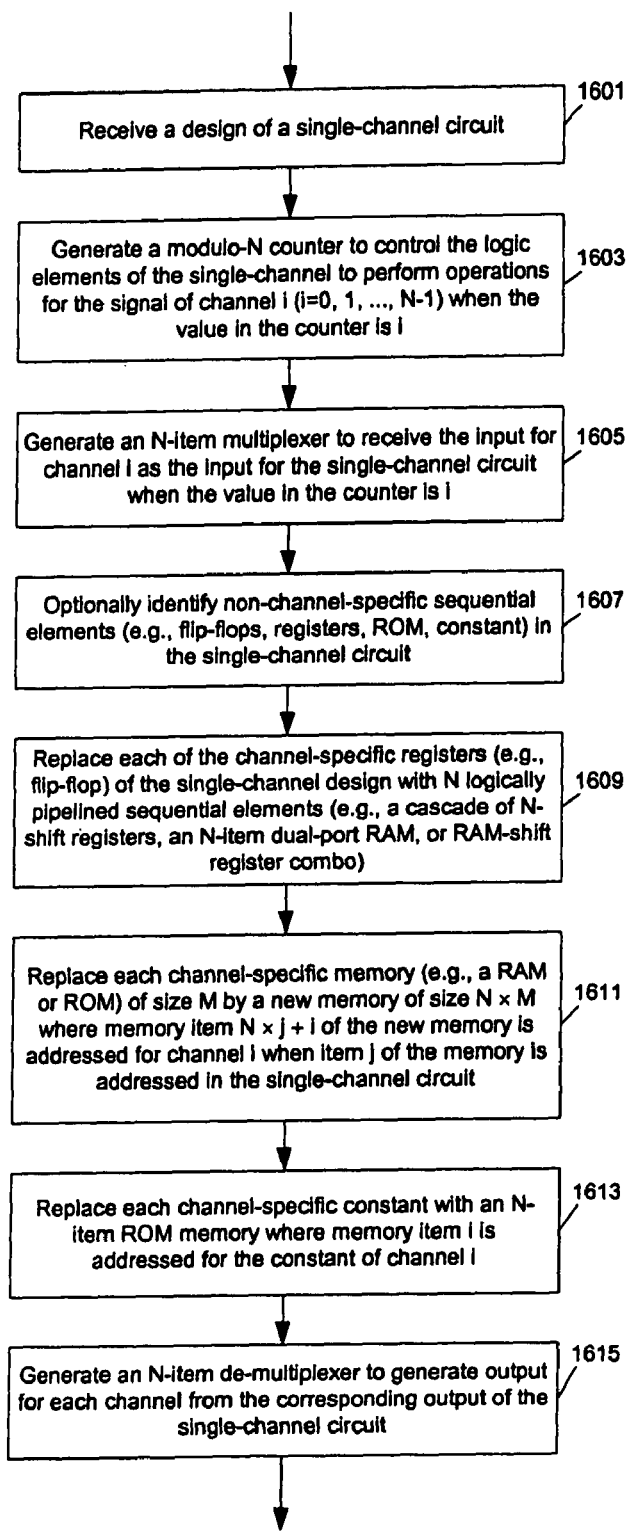
FIG. 16 shows an example method to generate a multi-channel circuit from a single-channel circuit according to one embodiment of the present invention.

FIG. 16 shows an example method to generate a multi-channel circuit from a single-channel circuit according to one embodiment of the present invention. Operation 1601 receives a design of a single-channel circuit. Operation 1603 generates a modulo-N counter to control the logic elements of the single-channel to perform operations for the signal of channel i (i=0, 1, ..., N−1) when the value in the counter is i. Operation 1605 generates an N-item multiplexer to receive the input for channel i as the input for the single-channel circuit when the value in the counter is i. Operation 1607 optionally identifies non-channel-specific sequential elements (e.g., flip-flops, registers, ROM, constant, RAM) in the single-channel circuit. Operation 1609 replaces each of the channel-specific registers (e.g., flip-flop) of the single-channel design with N sequential elements (e.g., a cascade of N-shift registers, an N-item dual-port RAM, or RAM-shift register combo). Operation 1611 replaces each channel-specific memory (e.g., a RAM or ROM) of size M by a new memory of size N×M where memory item N×j+i of the new memory is addressed for channel i when item j of the memory is addressed in the single-channel circuit. Operation 1613 replaces each channel-specific constant with an N-item ROM memory where memory item i is addressed for the constant of channel i. Operation 1615 generates an N-item de-multiplexer to generate output for each channel from the corresponding output of the single-channel circuit.

In one embodiment of the present invention, a retiming algorithm (e.g., cutset retiming and pipelining, retiming for clock period minimization, such as those described in "VLSI digital signal processing systems: design and implementation", by Keshab K. Parhi, Wiley-Interscience, 1999, pp. 91-118, or others known in the art) is further used to improve the clock rate of the circuit, using the registers introduced during the automatic generation of the multi-channel circuit.

During the process of a circuit design, a negative latency register, which has a negative delay, can be used in an intermediate stage (e.g., in peripheral retiming, or in architectural retiming). While no physical negative latency register exists, it is understood that a negative latency register indicates a timing constraint at an intermediate state of design. Negative latency registers can be used in the early stage of the design process; and the negative latency registers are typically eliminated during the process of circuit design to achieve a final solution.

In one embodiment of the present invention, a single-channel system is specified with one or more negative latency registers; and, the negative latency registers can be transformed in a similar fashion as the regular registers.

Figure 17:
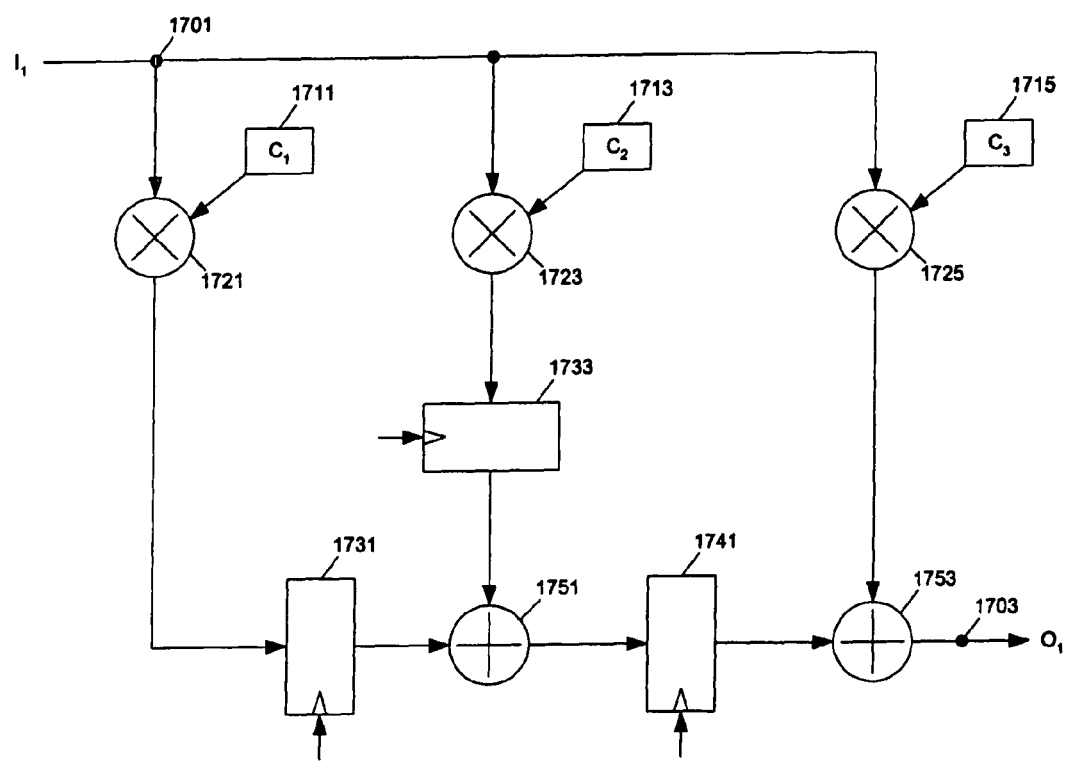
FIGS. 17-21 illustrate examples of generating a multi-channel circuit from a single-channel circuit with negative latency registers according to one embodiment of the present invention.

FIG. 17 shows an example of a single-channel system. For the purpose of illustration, the latency of elements other than registers is ignored. Each register (e.g., 1731, 1733 and 1741) has a one-unit latency. Elements 1711, 1713 and 1715 are constants, which do not change in time. Thus, assuming the input on line 1701 is $I_1(t)$, the signal on line 1703 is $I_1(t) \times C_3 + I_1(t-2) \times C_2 + I_1(t-2) \times C_1$. In FIG. 17, register 1731 stores the intermediate result from multiplier 1721 to generate $I_1(t-1) \times C_1$; and, register 1733 stores the intermediate result from multiplier 1723 to generate $I_1(t-1) \times C_1$. Register 1741 stores the intermediate result from adder 1751 to generate $I_1(t-2) \times C_2 + I_1(t-2) \times C_1$.

Figure 18:
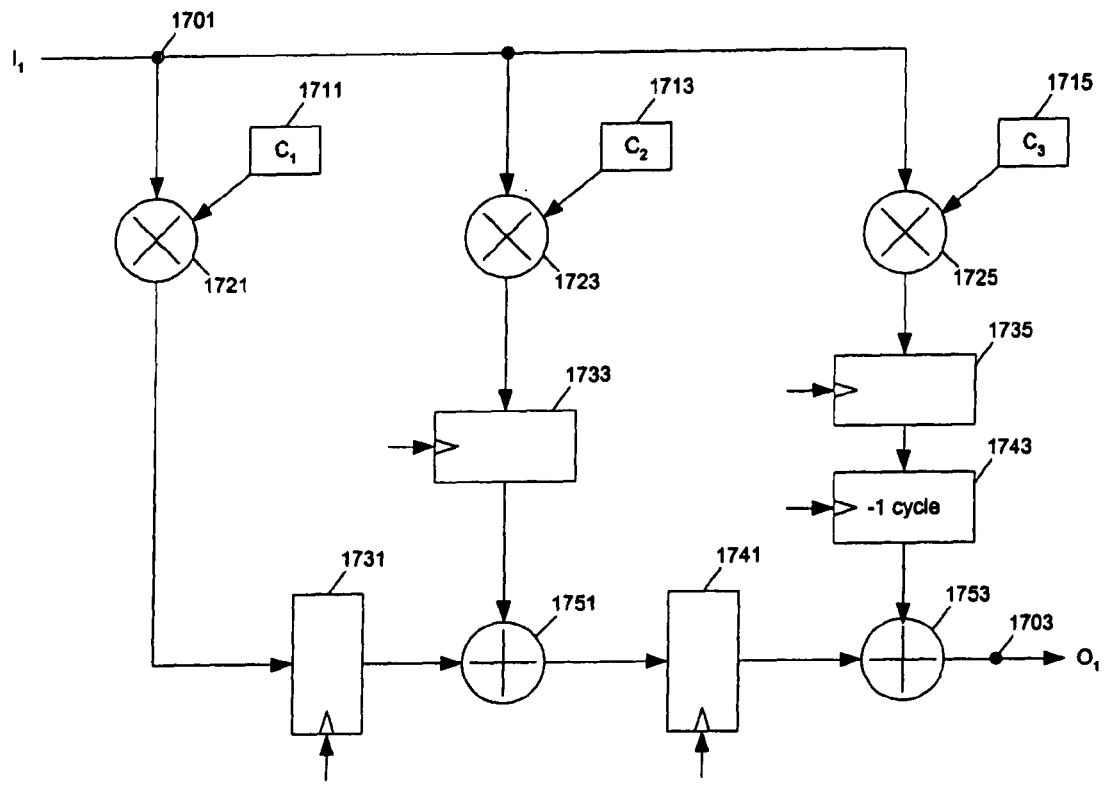
Figure 19:
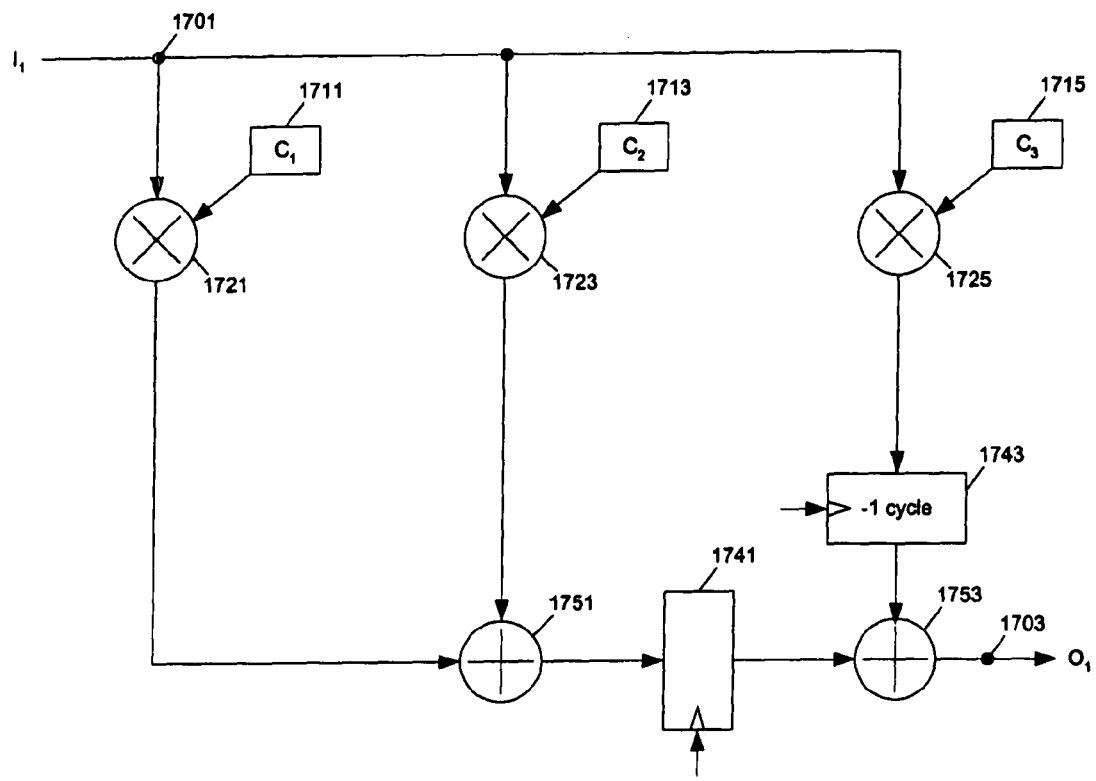
Figure 20:
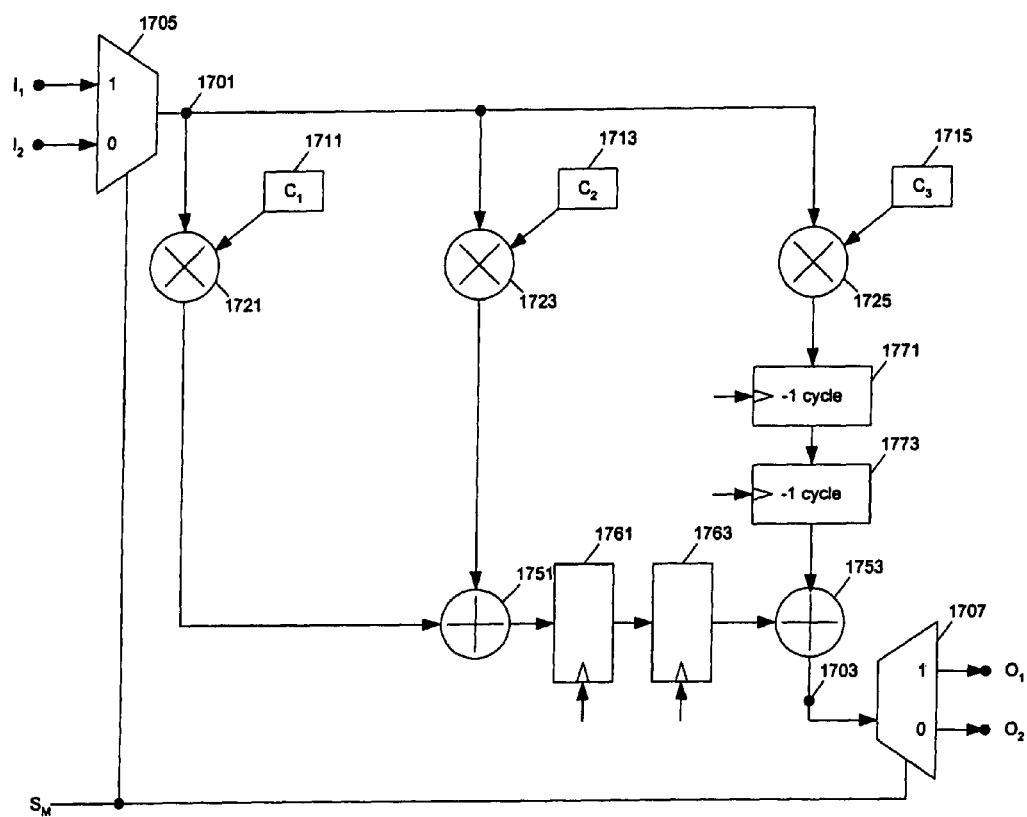
Figure 21:
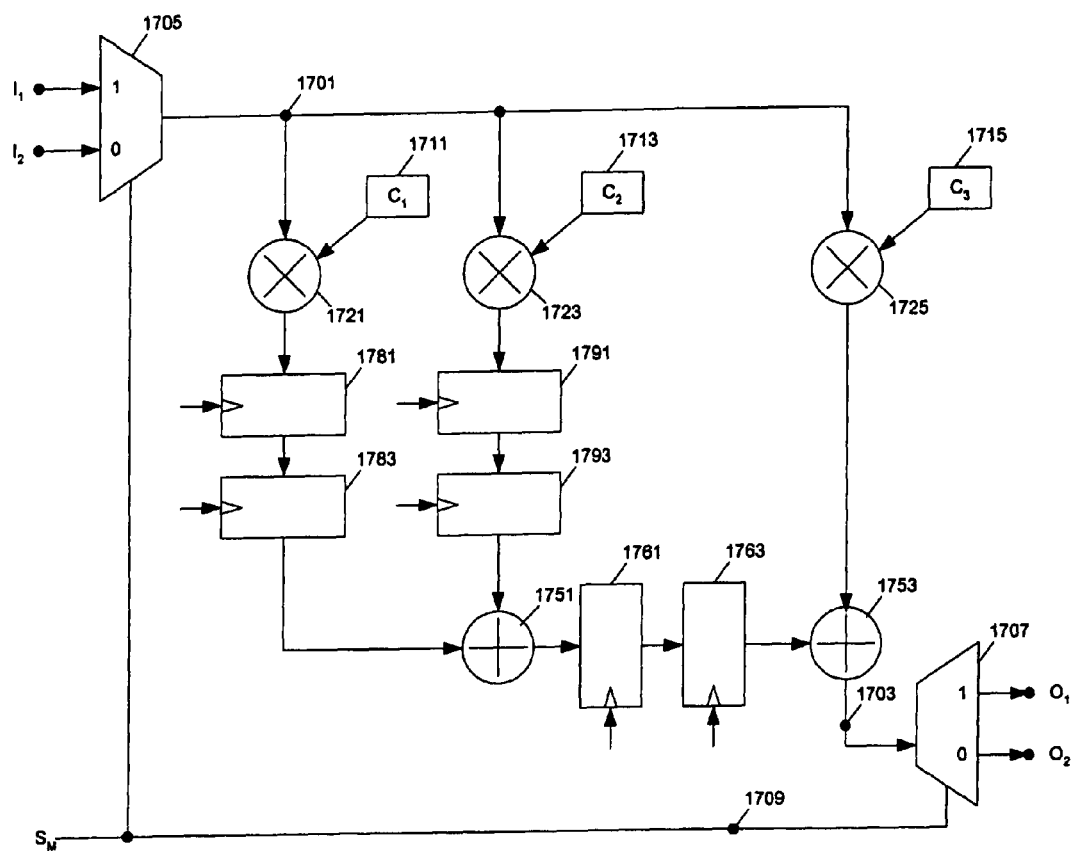
Figure 22:
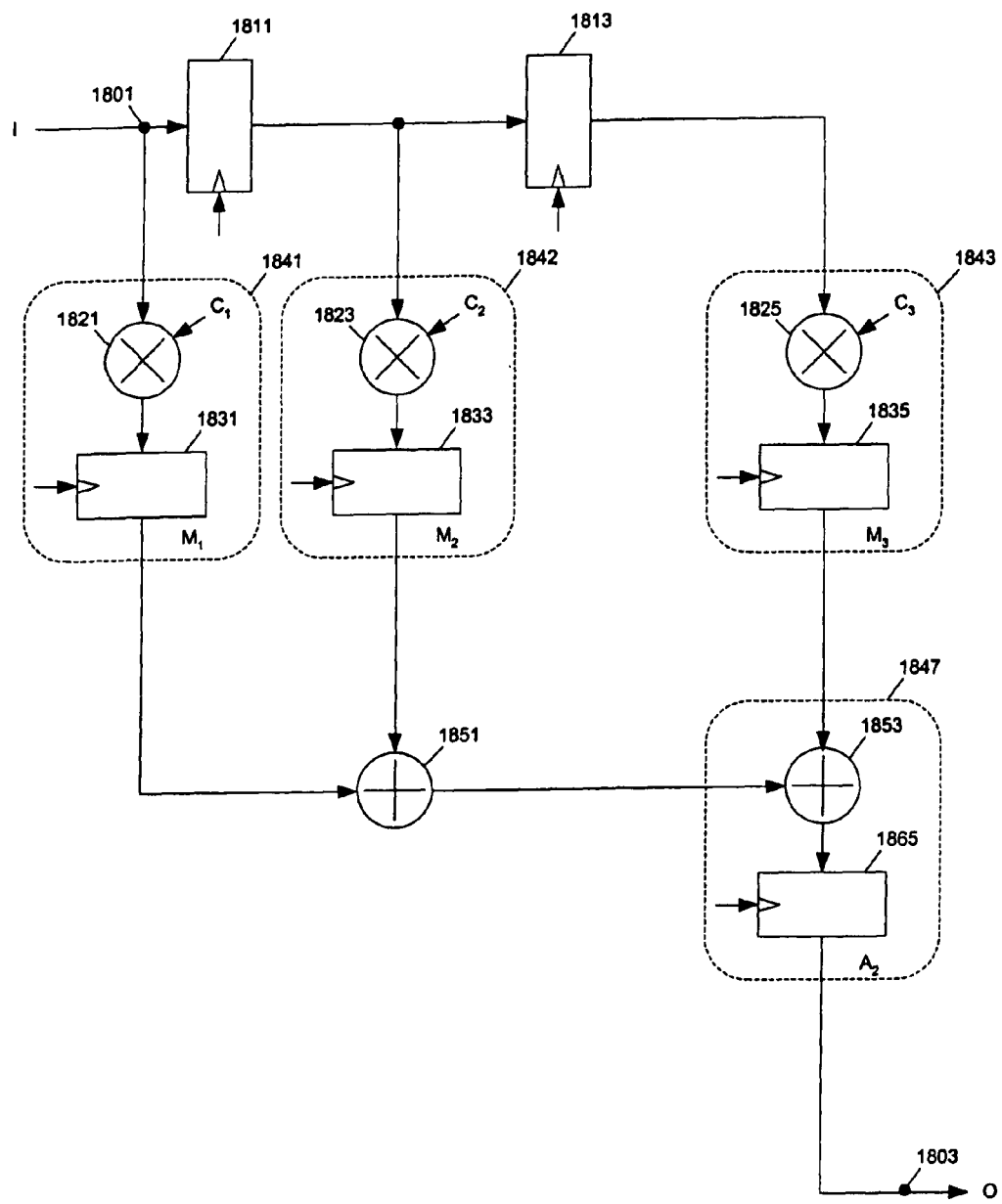
FIGS. 22-25 illustrate another example of generating a multi-channel circuit from a single-channel circuit using negative latency registers according to one embodiment of the present invention.

A pair of positive and negative latency registers can be inserted into path between multiplier 1725 and adder 1753. After the insertion, the circuit in FIG. 17 is transformed to that in FIG. 18. In FIG. 18, register 1743 is a negative latency register; and, register 1735 is a regular register (positive latency register). It is seen that in FIG. 18 registers 1731, 1733 and 1735 is a set of pipeline register. Note that the removal of the set of pipeline register (1731, 1733 and 1735) changes the latency of the signal-channel circuit (which may be acceptable or desirable in some instances); alternatively, a register (not shown in FIG. 19) can be inserted before point 1701 in FIG. 19 to have a single-channel circuit that has the same latency as that of the circuit in FIG. 18. Thus, the single-channel circuit in FIG. 18 can be specified as that in FIG. 19. In FIG. 19, assuming the input on line 1701 is $I_1(t)$, the output on line 1703 is $I_1(t+1) \times C_3 + I_1(t-1) \times C_2 + I_1(t-1) \times C_1$. Thus, apart from a one-unit timing shift, the circuit in FIG. 19 performs essentially the function as the circuit in FIG. 17 (or FIG. 18). When the circuit in FIG. 19 is specified as an input, a multi-channel circuit can be automatically generated. Registers 1741 and 1743 are not pipeline registers; and, they can be replace with multiple cascaded registers. FIG. 20 shows an example of a two-channel circuit automatically generated from the input of FIG. 19. Negative latency register 1743 in FIG. 19 is replaced with cascaded negative latency registers 1771 and 1773; and, register 1741 in FIG. 19 is replaced with cascaded registers 1761 and 1763. Multiplexer 1705 is added to feed the input signals into the shared channel one at a time; and, demultiplexer 1707 is added to restore the output from the shared channel one at a time. After the generation of the multi-channel circuit, a retiming algorithm (e.g., those described in "VLSI digital signal processing systems: design and implementation", by Keshab K. Parhi, Wiley-Interscience, 1999, pp. 91-118, or others known in the art) can be used to optimize the system. For example, pipeline register sets can be inserted into eliminate the negative latency registers. For example, two pipeline register sets can be inserted after multipliers 1721, 1723 and 1725 to generate the circuit in FIG. 21. Note that, as described previously, the insertion or deletion of pipeline register sets can change the timing for the generation of output on line 1703 in general; and thus, a proper number of registers (or delay elements) can be used on line 1709 to adjust the timing of the control signal for the demultiplexer 1707 (as illustrated in FIG. 11), the correspondence between the control signal and the output line can be adjusted (as illustrated in FIG. 13). It is seen that the circuit in FIG. 21 can be generated directly from the circuit of FIG. 17, according to embodiments of the present invention. Note that the two pipeline register sets can also be inserted after multipliers 1725 and adder 1751 in FIG. 20 to eliminate negative latency registers.

Further, in one embodiment of the present invention, one or more pairs of positive and negative latency registers are introduced into the single-channel system in the process of identifying pipeline registers. For example, after the single-channel circuit of FIG. 17 is received for the generation of multi-channel circuit; a positive and negative latency register pair (e.g., 1735 and 1743 in FIG. 18) is inserted for identifying pipeline registers. As illustrated in FIG. 18, once regular register 1735 and negative latency register 1743 are inserted, pipeline register sets (1731, 1733 and 1735) can be identified. Thus, only registers 1741 and 1743 of FIG. 18 are replaced with corresponding cascaded registers. Similarly, retiming algorithms can be used to further optimize the circuit of the automatic generation of the multi-channel circuit.

FIGS. 22-25 illustrate another example of generating a multi-channel circuit from a single-channel circuit using negative latency registers according to one embodiment of the present invention. The single-channel filter of FIG. 22 has pipelined adder 1847 ($A_2$) and pipelined multipliers 1841-1843 ($M_1$-$M_3$). A pipelined adder has an embedded register. For example, pipelined adder 1847 has register 1865, which is a physical part of the pipelined adder and cannot be moved out. Similarly, a pipelined multiplier also has an embedded register (e.g., pipelined multipliers 1841, 1842 and 1843 have registers 1831, 1833 and 1835 respectively).

Figure 23:
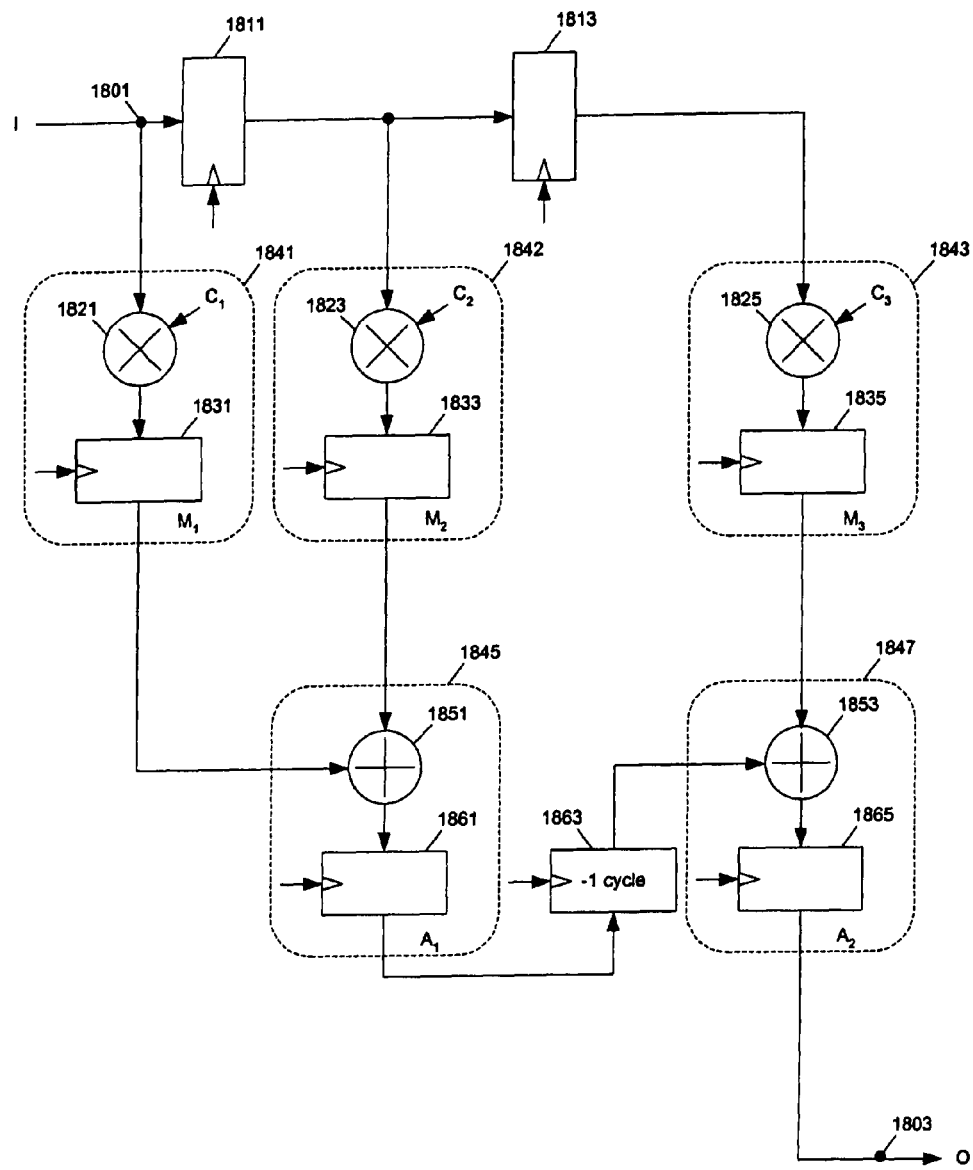
Figure 24:
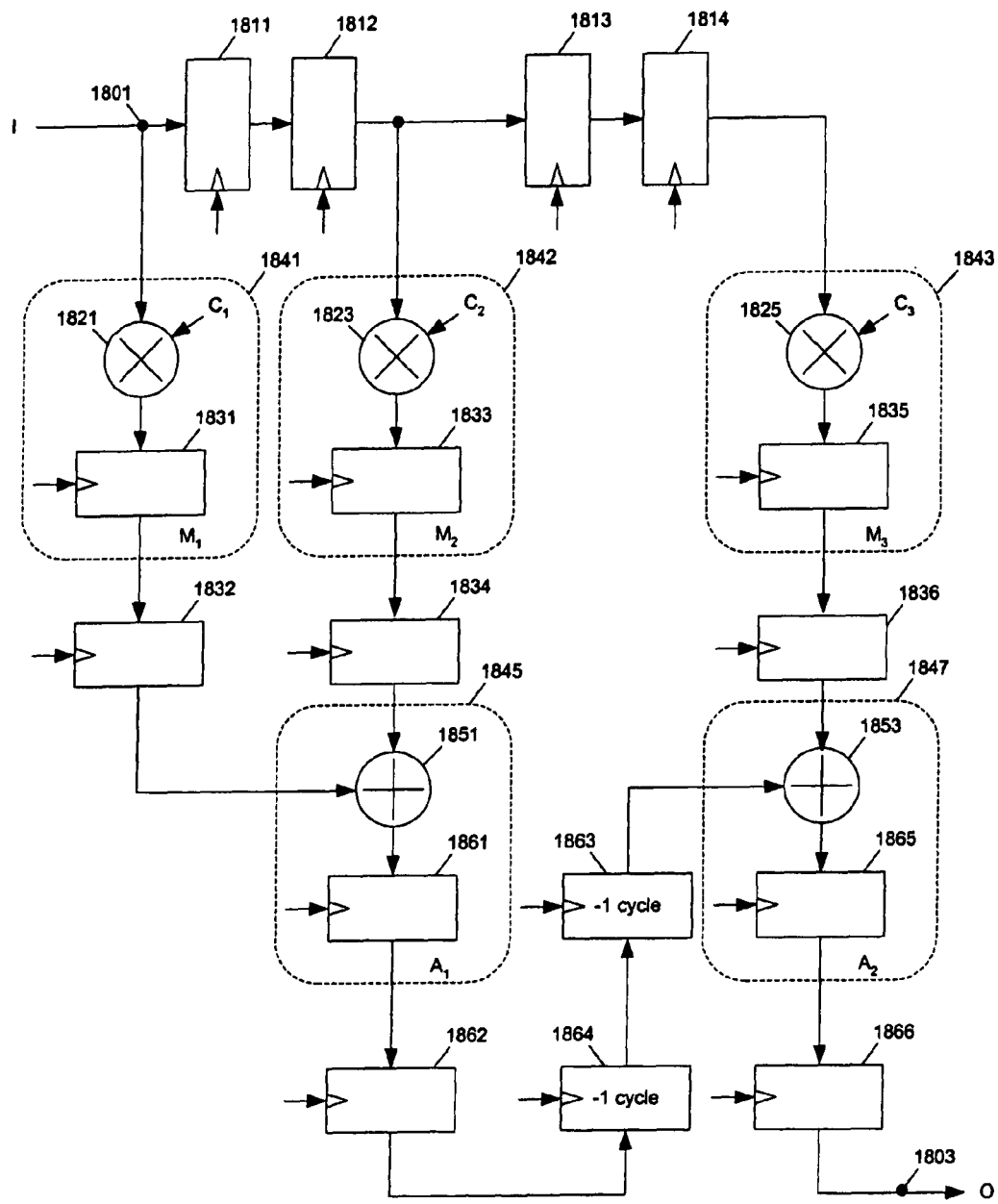

Consider that a pipelined adder is to be used to implement adder 1851. Without using a negative latency register, a set of regular registers may be added (e.g., on both the input lines for adder 1853) to provide adder 1851 a register. Such an approach can lead to the increase of the latency of the single channel system. Alternatively, FIG. 23 shows an example in which a pair of positive and negative latency registers (1861 and 1863) are added between adders 1851 and 1853. Thus, adder 1851 and register 1861 can be implemented as a pipelined adder 1845 ($A_1$). Note that negative latency register cannot be eliminated in the single-channel system even with retiming.

A multi-channel circuit can be automatically generated according to embodiments of the present invention. For example, FIG. 23 shows the time-shared portion of a multi-channel circuit, generated according to one embodiment of the present invention for a two-channel circuit. Note that the input multiplexing portion and the output de-multiplexing portion of the two-channel circuit are not shown in FIG. 24. Registers 1831, 1833 and 1835 are channel specific in FIG. 23; and, registers 1832, 1834 and 1836 are inserted in FIG. 24 for the multi-channel circuit. Similarly, registers 1861 and 1863 in FIG. 23 are replaced with cascaded register sets (1861, 1862 and 1863 and 1864) in FIG. 24.

Figure 25:
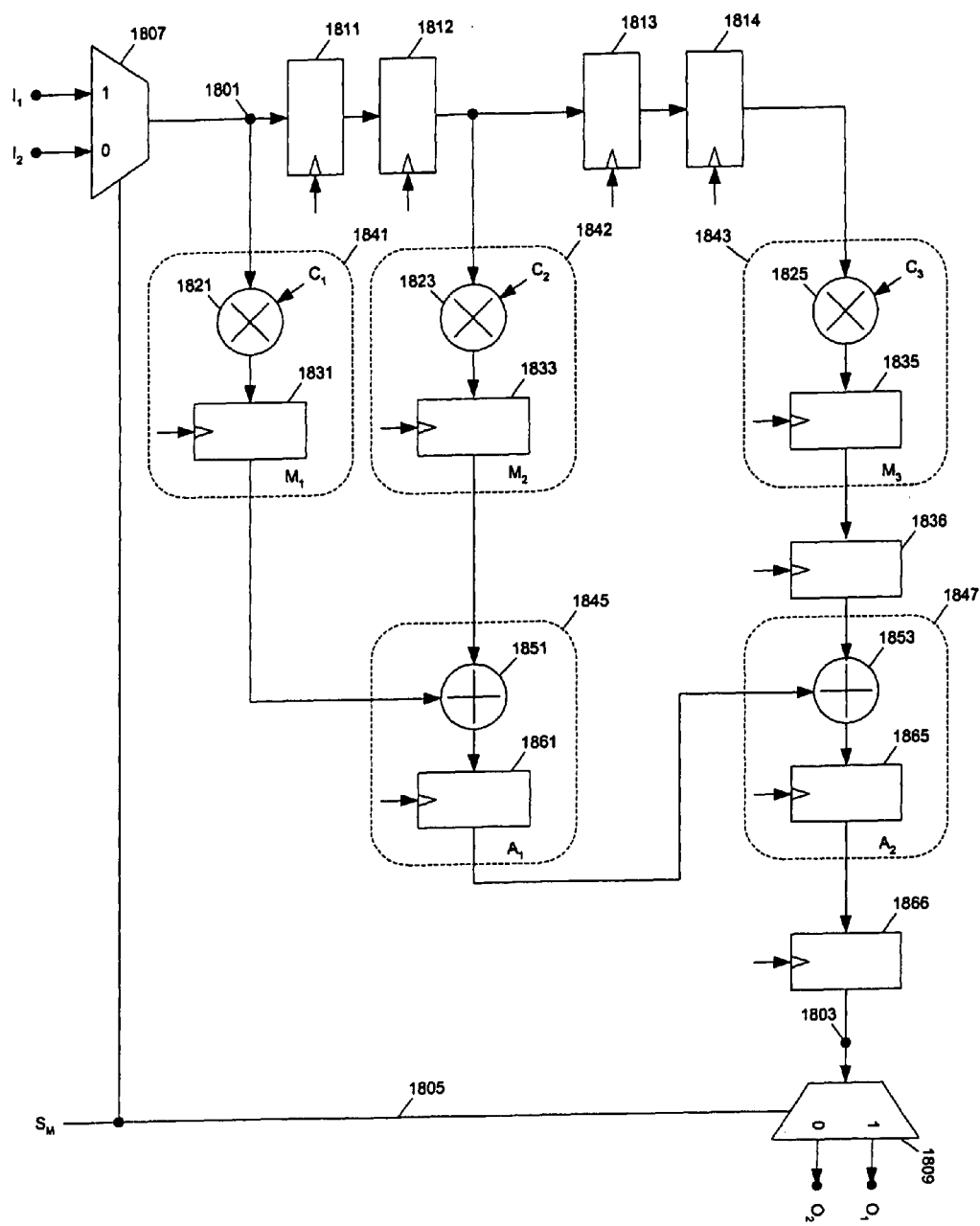

In the two-channel circuit generated according to one embodiment of the present invention, extra registers are generated for each of the pipelined operators. And, a retiming operation can be used to remove the negative registers. For example, registers 1832 and 1834 in FIG. 24 can be moved to the path between adders 1851 and 1853 in a retiming operation so that there are sufficient regular registers on the path between adders 1851 and 1853 to cancel out the negative registers (1863 and 1864). Thus, an example resulting two-channel circuit is shown in FIG. 25. In FIG. 25, multipliers 2821, 1823 and 1825 and adders 1851 and 1853 can be implemented as corresponding pipelined operators (pipelined multipliers 1841, 1842 and 1843 and pipelined adders 1845 and 1847). However, all negative latency registers are eliminated after retiming.

Pipelined adders and pipelined multipliers are illustrated in the above example. However, from this description, it will be appreciated that other pipelined logic elements or pipelined IP blocks can also be treated in a similar fashion.

In one embodiment of the present invention, no pipeline register sets are identified; and, all registers are considered as channel-specific. For example, an automatic method to transform a single-channel system into an N-channel system includes the following operations.

1. Generate a modulo-N counter as an N-state finite-state-machine (FSM). The state variable of the FSM is denoted as cnt. The m'th channel ($0 \leq m \leq N-1$) of the system is effectively activated when the FSM is in the m'th state (e.g., when cnt=m).

2. Replace each register by a cascade of N-shift registers (or alternatively, if N is large, each register can be replaced with an N-item dual-port RAM or a RAM-shift register combo).

3. Replace each RAM memory of size M by a RAM memory of size N×M. The address generation circuitry is modified or added to address the memory items such that memory item A of the single-channel design is replaced by an item at address N×A+cnt. It is understood that other address transformation scheme can also be used to logically pipeline memory items so that the output from the new memory is synchronized with the state of the FSM. The transformed address is typically a function of the original address, the state of the FSM, and the active channel number.

4. When there is a channel-specific ROM (e.g., ROM contents vary from channel to channel), apply a transform similar to that for the RAM so that ROM item N×A+m holds the contents of the ROM item A for m'th channel. If the ROM is not channel specific, no transformation is necessary.

5. If there is a channel-specific constant (e.g., constant value varies from channel to channel), replace it with an N-item ROM. The address line of the ROM is driven by cnt (or cnt−1 if there is one clock latency in ROM access). If the constant is not channel specific, no transformation is necessary.

The inputs of the different channels may be multiplexed over a common port. If multiple channels have their distinct input ports, multiplex these inputs by an N-item multiplexer with a selection line driven by cnt, which is N-times faster than the clock driving the inputs. Similarly, the outputs of the different channels may be multiplexed over a common port. If multiple channels have their distinct output ports, de-multiplex the outputs by an N-item decoder with a selection line driven by cnt. The outputs can be latched with an N-times slower clock. The other components of the single-channel design are kept as is as the shared resources through time multiplexing.

In another embodiment of the present invention, pipeline register sets are identified to avoid the generation of registers. For example, an automatic method to transform a single-channel system into an N-channel system includes the following operations.

1. Identify the pipeline registers in the system to cover as many and as wide registers as possible. There can be more than one set of pipeline registers; but the sets must be mutually exclusive. Any register not classified into any of the pipeline register sets is a state register. Pipeline registers are non-channel-specific; and, state registers are channel-specific. If there are P distinct pipeline register sets, the system is partitioned into P+1 disjoint subsystems, forming a singly linked list of subsystems. In this list, each feed-forward cutset defines a link, with the direction of the link indicating the direction of data flow. Denote $S_i$ the subsystem whose order in the linked list is i, where $0 \leq i \leq P$.

2. Generate P+1 N-state finite-state-machines (FSMs) from at least one modulo-N counter. Denote the state variable of i'th FSM ($0 \leq i \leq P$) as $cnt_i$. The hardware in subsystem $S_i$ processes the data of the m'th channel ($0 \leq m \leq N-1$) when the i'th FSM is in the m'th state (e.g., when $cnt_i$=m). When $mod((cnt_i-cnt_j), N)=mod((j-i), N)$ for $\forall i, j$ in [0,P], correct synchronization is maintained among the subsystems. This relation is satisfied if $cnt_i$ is a one-clock delayed version of $cnt_{i-1}$. (i=1, 2, . . . , N−1). Thus, $cnt_i$ can be derived from $cnt_{i-1}$ using a register; and, the FSMs can be implemented using one modulo-N counter and a cascade of registers.

3. Replace each state register with a cascade of N-shift registers (or alternatively, if N is large, each state register can be replaced with an N-item dual-port RAM or a RAM-shift register combo).

4. Replace each RAM memory of size M by a RAM memory of size N×M. For a RAM within the subsystem $S_i$, the address generation circuitry is modified or added to address the memory items such that memory item A of the single-channel design is replaced by an item at address N×A+$cnt_i$. It is understood that other address transformation scheme can also be used to logically pipeline memory items so that the output from the new memory is synchronized with the state of the i'th FSM. The transformed address is typically a function of the original address, the state of the i'th FSM, and the active channel number.

5. When there is a channel-specific ROM (e.g., ROM contents vary from channel to channel), apply a transform similar to that for the RAM so that ROM item N×A+m holds the contents of the ROM item A for m'th channel. If the ROM is not channel specific, no transformation is necessary.

6. If there is a channel-specific constant (e.g., constant value varies from channel to channel) within the subsystem $S_i$, replace it with an N-item ROM. The address line of the ROM is driven by $cnt_i$ (or $cnt_i$−1 if there is one clock latency in ROM access). If the constant is not channel specific, no transformation is necessary.

The inputs of the different channels may be multiplexed over a common port. If multiple channels have their distinct input ports, multiplex these inputs by an N-item multiplexer with a selection line driven by $cnt_0$, which is N-times faster than the clock driving the inputs. Similarly, the outputs of the different channels may be multiplexed over a common port. If multiple channels have their distinct output ports, de-multiplex the outputs by an N-item decoder with a selection line driven by $cnt_P$. The outputs can be latched with an N-times slower clock. The other components of the single-channel design are kept as is as the shared resources through time multiplexing.

Although P+1 N-state finite-state-machines can be used to control the timing of the P+1 subsystems individually, alternatively, one single N-state FSM can be used to control the operation of all subsystems, where different subsystems process for a given channel when the state of the FSM reaches different values. For example, the hardware in subsystem $S_i$ processes the data of the m'th channel ($0 \leq m \leq N-1$) when the FSM is in the state cnt=mod (m−i, N).

Pipeline register sets can be identified and removed, when timing constraints permit. For example, the set of pipeline registers 1011 in FIG. 10 can be removed to generate the design of FIG. 2; or, the pipeline register set 1011 of FIG. 11 can be removed automatically to generate the design of FIG. 7. Similarly, pipeline registers can also be added to a design automatically. Note that the addition or deletion of pipeline registers in general changes input to output latency of the circuit; however, such changes are acceptable for most cases.

In one embodiment of the present invention, employing shift registers with run-time-configurable depth and using modulo-N counters with run-time-configurable modulus, the folding rate N can be changed in run-time, without interrupting the operation. For the applications in which the number of active channels is a dynamic parameter, the folding rate can be adapted to the number of active channels, allowing the clock rate to be reduced, when possible, to reduce the power consumption.

Thus, at least one embodiment of the present invention automatically generates a design for a multi-channel system from the input of the design of single-channel system. The single-channel system design is automatically transformed into an N-channel system with time-multiplexed resource sharing of logical (computational) units. The transform is simple and very fast; and, the resulting design of the hardware is very efficient.

Since methods of various embodiment of the present invention generate a time-multiplexed multi-channel design from a single-channel design, fast optimization and synthesis operations can be performed on the reduced number of logic elements. The usage of control logic can be minimized. For some FPGA architectures, the memory usage of the synthesized system can be made very efficient. Further, various methods of the present invention allow for high pipeline orders and significant speed-ups.

Figure 26:
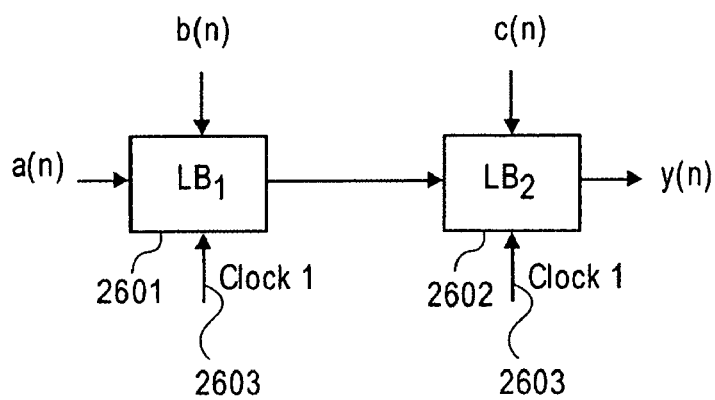
FIG. 26 shows one embodiment of a design of a single channel digital signal processing system that has a plurality of instances of a logic block.

FIG. 26 shows one embodiment of a design of a single channel digital signal processing ("DSP") system that has a plurality of instances of a logic block. As shown in FIG. 26, a first design 2600 of the system has a first instance 2601 (logical block LB1) coupled to a second instance 2602 (logical block LB 2). In one embodiment, each of instances 2601 and 2602 performs a logical operation that corresponds to the same logical block. In one embodiment, instances 2601 and 2602 are identical logical blocks. In one embodiment, the logical block of the instances 2601 and 2602 includes one or more functional units (not shown), e.g., multipliers, adders, subtractors, dividers, and one or more internal states (not shown), e.g., one or more memory elements, feedback elements, and the like. In one embodiment, the logical block of instances 2601 and 2602 is a Multiply and Accumulate ("MAC") block. As shown in FIG. 26, design 2600 of the single channel system has three inputs a(n), b(n), and c(n), and one output y (n). In one embodiment, instances 2601 and 2602 are coupled sequentially. As shown in FIG. 26, design 2600 of the single channel system has three inputs a(n), b(n), and c(n), and one output y (n). In one embodiment, n is a time index at each sample clock. As shown in FIG. 26, design 2600 of the system is driven by a clock 2603 ("clock 1"). At any instant of time, an output y(n) of system 2600 depends on inputs a(n), b (n), c(n), and on one or more internal states (not shown) of each of the instances 2601 and 2602. At each sample clock cycle of clock 2603, the design of the system 2600 performs operations on the input values a (n), b(n), and c(n) using LB1 and LB2 and outputs the result y (n).

Figure 27:
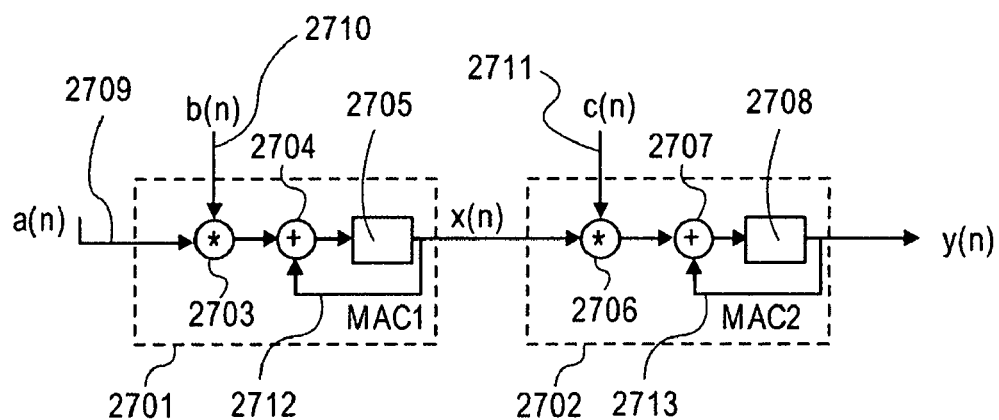
FIG. 27 shows one embodiment of a design of a single channel DSP system that has a plurality of instances of a MAC logic block.

FIG. 27 shows one embodiment of a design of a single channel DSP system that has a plurality of instances of a MAC logic block. As shown in FIG. 27, design 2700 of the system has a first instance 2701 ("MAC1") coupled sequentially to a second instance 2701 ("MAC2"). As shown in FIG. 27, MAC1 and MAC2 are identical MAC blocks. As shown in FIG. 27, MAC1 and MAC2 have multipliers 2703 and 2706. Multiplier 2703 is coupled to multiply inputs 2709 ("a(n)") and 2710 ("b(n)"), as shown in FIG. 27. Output of multiplier 2703 is connected to input of adder 2704, as shown in FIG. 27. An output of adder 2704 provides an input to internal state 2705, as shown in FIG. 27. In one embodiment, output of MAC operation of instance 2701 is fed to input of instance 2702 in a streaming manner.

In one embodiment, internal state 2705 includes a memory element, for example, a register, flip-flop, RAM, other memory element, and any combination thereof. As shown in FIG. 27, the output of internal state 2705 is connected to input of instance 2702, and is also connected back to input of adder 2704. Multiplier 2706 is coupled to multiply input 2711 ("c (n)") and the output of internal state 2705, as shown in FIG. 27. An output of multiplier 2706 provides an input to adder 2707, as shown in FIG. 27. The output of adder 2707 provides an input to internal state 2708. As shown in FIG. 27, the output of internal state 2708 provides an output y (n) of the system, and is also connected back to provide input to adder 2707. In one embodiment, each of internal states 2705 and 2708 are memory elements, e.g., registers, flip-flops, RAM, other memory elements, and any combinations thereof. In one embodiment, each of internal states 2705 and 2708 is a delay element. In one embodiment, the output of internal state 2705 is connected back to adder 2704, and the output of internal state 2708 is connected back to adder 2707 to perform "accumulate" operation. That is, a current result from a multipliers 2703 is added to a previous result of multiplier 2703 though an internal feedback, and the current result from multiplier 2706 is added to a previous result of multiplier 2706 through another internal feedback, as shown in FIG. 27.

As shown in FIG. 27, at any instant of time the output y (n) of single channel system 2700 depends on internal state 2708. Internal state 2708 depends on the past values of inputs 2709, 2710, 2711, and past values of internal states 2705 and 2708. In one embodiment, internal state 2705 contains a previous state of instance 2701, and 2708 contains a previous state of instance 2702. For example, if each of inputs a(n), b(n), and c(n) are ones, the output x (n) of instance 2701 versus time is a sequence of 0, 1, 2, 3, 4, 5, 6, 7, 8, and so on, then an output y (n) of instance 2702 versus time is 0, 0, 1, 2+1, 3+3, 6+4, and so on. That is, while output of instance 2701 grows linearly with time because it accumulates constant input, output of instance 2702 grows non-linearly with time because it accumulates linear input.

FIG. 36 shows a flowchart of one embodiment of a method to automatically perform folding of a digital system. Method 3600 begins with operation 3601 that involves receiving of a first design of a system having a plurality of first instances of a logical block to perform logical operations. The first instances have internal states, as described above. Next, method 3600 continues with operation 3602 that involves automatically transforming of the system to generate a second design having a time-shared second instance of the logical block. In one embodiment, the second design of the system is a single-channel system having a single output.

Figure 28:
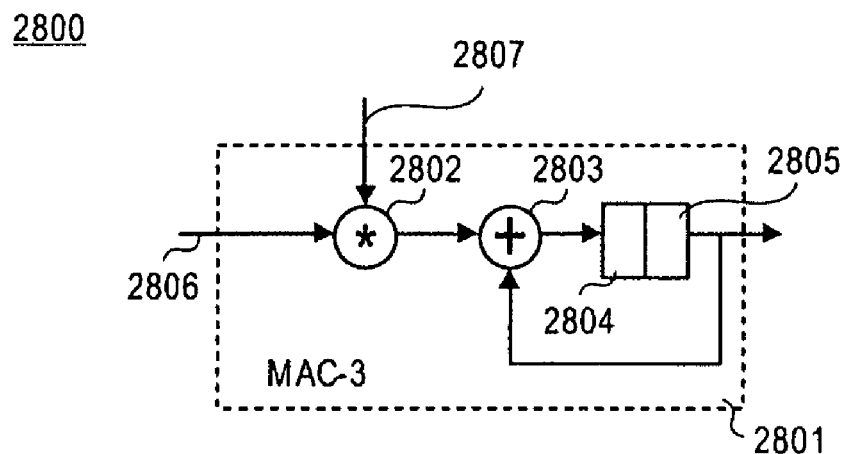
FIG. 28 shows one embodiment of a time-shared instance of MAC logical block.

FIG. 28 shows one embodiment of a time-shared instance of MAC logical block. As shown in FIG. 28, a time-shared instance 2801 ("MAC 3") includes a multiplier 2802 to multiply inputs 2806 and 2807. An output of multiplier 2802 is connected to input of an adder 2803, as shown in FIG. 28. Output of adder is coupled to elements 2804 and 2805, as shown in FIG. 28. In one embodiment, elements 2804 and 2805 are used to time multiplex internal states 2705 of MAC1 and 2708 of MAC 2, as described in further detail below. Elements 2804 and 2805 represent internal states 2705 and 2708. In one embodiment, e.g., when element 2804 and element 2805 include a dual-port RAM, element 2804 is mapped to internal state 2704, and element 2805 is mapped to internal state 2708, or element 2804 is mapped to internal state 2708, and element 2805 is mapped to internal state 2704. In one embodiment, if elements 2804 and 2805 are shift registers, mapping of elements 2804 and 2805 switches between states 2l+0 and 2l+1 depicted in FIG. 29. For example, in state 2l+0 element 2805 maps to internal state 2705, and in state 2l+1 element 2805 maps to internal state 2708. In one embodiment, elements 2804 and 2805 are memory elements, e.g., registers, flip-flops, RAM, other memory elements, and any combinations thereof. In one embodiment, elements 2804 and 2805 are shifting sequential register elements coupled to each other into a cascade. In one embodiment, elements 2804 and 2805 include a cascade of multiple shifting sequential register elements.

Figure 29:
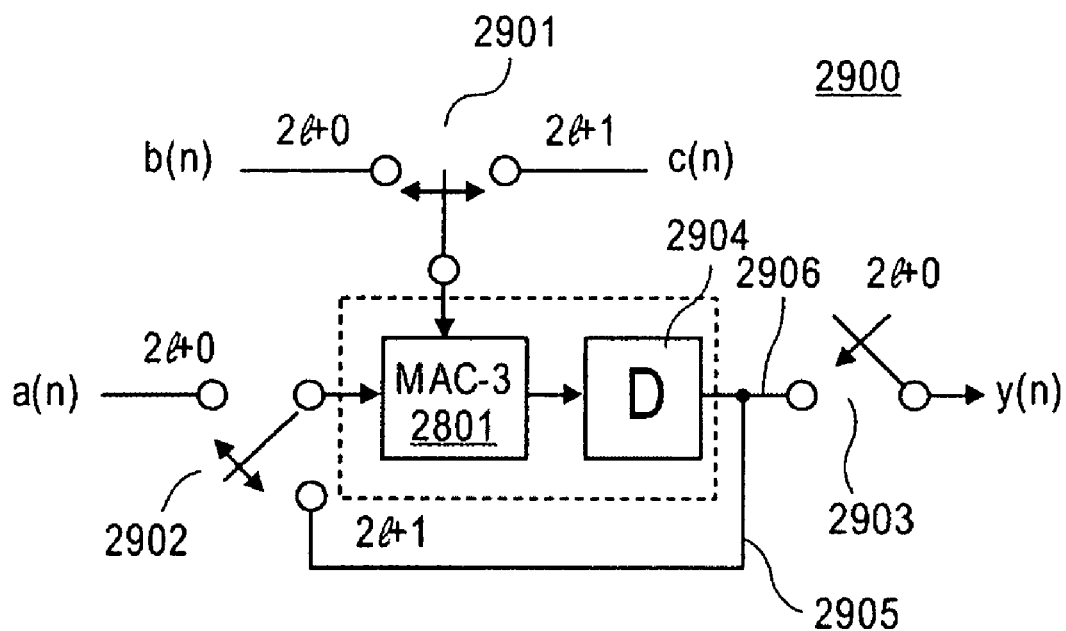
FIG. 29 shows one embodiment of a design of a single channel DSP system that has a time-shared instance of the MAC logical block.

FIG. 29 shows one embodiment of a design of a single channel DSP system that has a time-shared instance of the MAC logical block. As shown in FIG. 29, a plurality of instances 2701 and 2702 of first design 2700 are replaced with a single time-shared instance 2801 having elements 2804 and 2805 to time multiplex internal states 2705 and 2708. As shown in FIG. 29, design 2900 of the system has switches 2901, 2902, and 2903. As shown in FIG. 29, MAC 1 and MAC2 operations are time multiplexed using switches 2901 and 2902 coupled to a single instance 2801 (MAC3). Switches 2901-2902 may be in a state 2l+0, or in a state 2l+1, where l=0, 1, 2, and etc. As shown in FIG. 29, when switches 2901 and 2902 are in state 2l+0, input a(n) and input b(n) are coupled to instance 2801 to perform a MAC1 operation. As shown in FIG. 29, the result of MAC1 operation may be stored in a delay element 2904 until state 2l+1. In one embodiment, delay element 2904 is a pipeline register. In one embodiment, delay element 2904 coupled to output of instance 2801 is optional and may not be needed for speed purposes. When switches 2901 and 2902 are in state 2l+1, input c(n) and output of delay element 2904 are coupled to instance 2801 to perform a MAC2 operation. As shown in FIG. 29, the result of MAC2 operation may be stored in delay element 2904 until state 21+0. The result of MAC2 operation is provided as output y (n) when switch 2903 is in state 21+0. As shown in FIG. 29, design 2900 of the system time-multiplexes inputs and internal states of the MAC logical block and produces time-multiplexed outputs. As shown in FIG. 29, time-shared instance 2801 receives time-multiplexed inputs and produces time-multiplexed outputs. That is, to fold operations of instances 2701 and 2702 of FIG. 27, internal states 2705 and 2708 are mapped to elements 2804 and 2805 of instance 2801 of FIG. 28. In one embodiment, each of elements 2804 and 2805 synchronize the previous output of each of the MAC1 and MAC2 operations to a current operation. In one embodiment, each of elements 2804 and 2805, e.g., a cascade of multiple shifting sequential register elements, are used for each of the time slots. In one embodiment each of elements 2804 and 2805 are internal memory elements that are not pipelined registers.

In one embodiment, design of system 2900 is a folded architecture that employs a multi-channelized instance 2801 of MAC. Generating of the multi-channel circuit is described above with respect to FIGS. 5-25. FIGS. 5-25 describe embodiments of circuits that have independent channels, wherein the same algorithm may be performed along the channels. In one embodiment, instance 2801 is a multi-channelized version of MAC. In one embodiment, when internal states 2705 and 2708 are time-multiplexed using a sequence of shift registers, all registers in the sequence are used by all of the channels.

Figure 30:
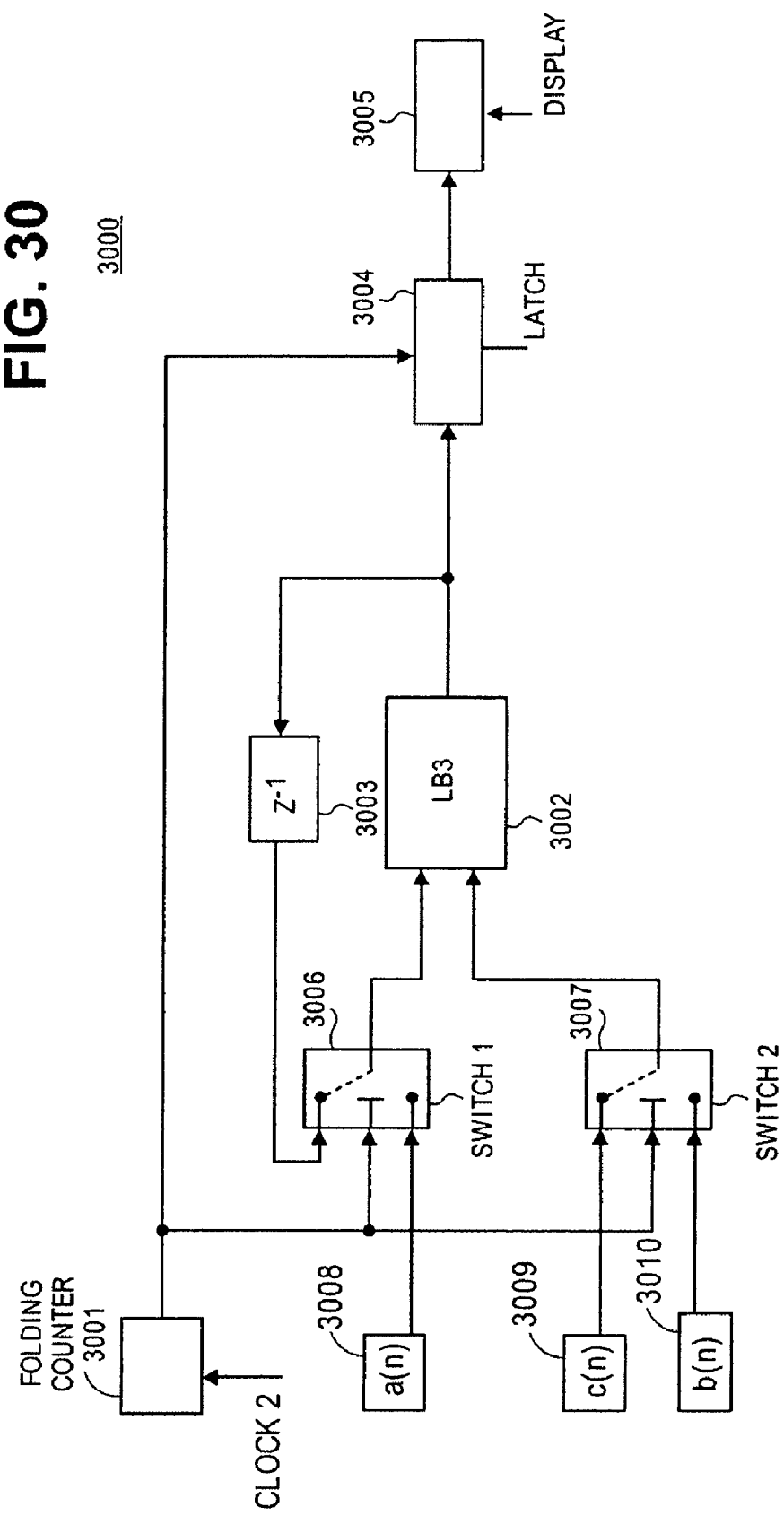
FIG. 30 shows another embodiment of a design of a single channel system having a time-shared instance of the logical block.

FIG. 30 shows another embodiment of a design of a single channel system having a time-shared instance of the logical block. As shown in FIG. 30, a design 3000 of the single channel system has a time-shared instance 3002 ("LB3") of the logical block. As shown in FIG. 29, a plurality of instances LB1 and LB2 of design 2600 are replaced with a single time-shared instance 2801 having elements 2804 and 2805 to time multiplex internal states of LB1 and LB2. As shown in FIG. 30, design 3000 has a folding counter 3001. Folding counter 3001 is driven by a clock 3011 ("clock 2") that is faster than clock 2601 that drives design 2600 of FIG. 26. In one embodiment, clock 2 is at least twice faster than clock 1. Each sample of clock 1 of design 2600 is split into two, using a twice faster clock 2 driving folding counter 3001. In one embodiment, folding counter 3001 is a one-bit counter, toggling between 0 and 1. In one embodiment, folding counter 3001 is 0 or 1 at the first half of each sample of clock the first design 2600 (clock 1) and is 1 or 0 at the second half of each sample clock of the first design 2600 (clock 1), as described in further detail below.

As shown in FIG. 30, operations of LB1 and LB2 of FIG. 26 are time multiplexed using switches 3006 and 3007 that are coupled to a single instance 3002 (LB3). Instance 3002 performs operations of LB1 or LB2 of FIG. 26 based on a signal from folding counter 3001, as shown in FIG. 30. In one embodiment, when folding counter 3001 outputs 0 or 1 that corresponds to the first half of each sample clock of clock 1, switch 3006 and switch 3007 connect inputs 3008 (a(n)) and 3010 (b(n)) to instance 3002 ("LB3"), so that instance 3002 performs an operation of LB1 of FIG. 26. As shown in FIG. 30, a result of the operation of LB1 may be stored in delay register 3003 until the second half of the sample clock. When folding counter 3001 outputs 1 or 0 that corresponds to the second half of each sample clock of clock 1, switch 3006 and switch 3007 connect inputs from delay element 3003 (e.g., a register) and input 3010 (c(n)) to instance 3002 ("LB3"), so that instance 3002 performs operation of LB2 of FIG. 26. As shown in FIG. 30, a result of LB2 operation may be stored in delay element 3003 until the first half of the sample clock. As shown in FIG. 30, switch 3006 outputs a time-multiplexed combination of signals a(n) and result of operation of LB1 to the input of time-shared instance 3002. Switch 3007 outputs a time-multiplexed combination of signals b(n) and c(n) to the input of time-shared instance 3002. As shown in FIG. 30, time-shared instance 3002 outputs a time-multiplexed combination of signals from operations of LB1 and LB2. As shown in FIG. 30, output of instance 3002 is coupled to latch 3004. Latch 3004 latches ("picks") signals from operation of LB2 based on a signal from folding counter 3001, as shown in FIG. 30. The latched signal from instance 3002 may be output to display 3005, as shown in FIG. 30. The latched signal from instance 3002 may be delayed by one sample clock relative to the signal that is output from instance 2602 of design 2600.

Figure 31:
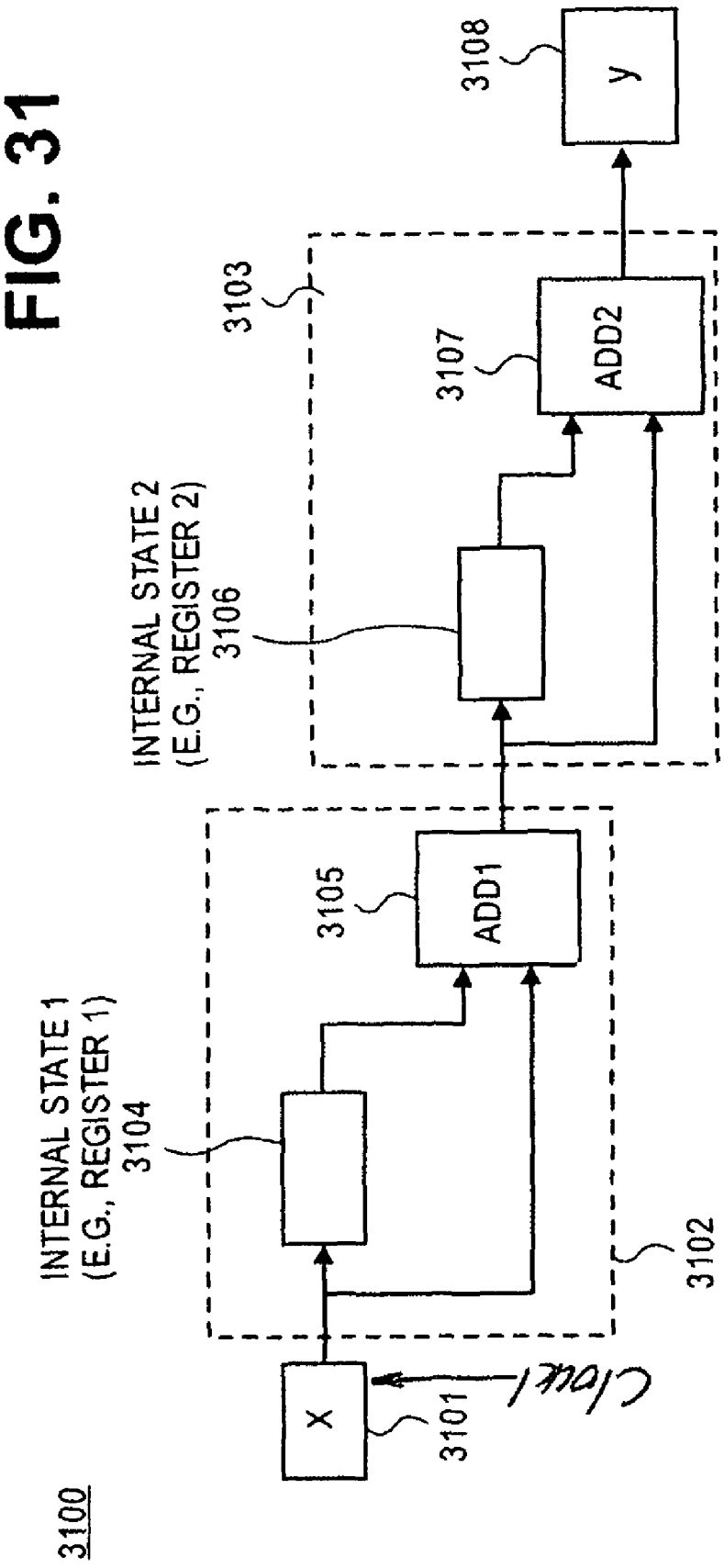
FIG. 31 shows one embodiment of a design of a single channel DSP system that has a plurality of instances of a finite impulse response filter logic block.

FIG. 31 shows one embodiment of a design of a single channel DSP system that has a plurality of instances of a logical block. The logical block may be, for example, a finite impulse response filter ("FIR"), and infinite impulse response filter ("IIR") ). As shown in FIG. 31, design 3100 of the system has a first instance 3102 (e.g., FIR1) coupled sequentially to a second instance 3103 (e.g., FIR2). As shown in FIG. 31, instances 3102 and 3103 are identical FIR blocks. As shown in FIG. 31, instances 3102 and 3103 have adders 3105 ("Add1") and 3107 ("Add2") and internal states 31-04 and 3106. Input 3101 ("X") is received by internal state 3104 and adder 3105, as shown in FIG. 31. The output of internal state 3104 and input 3101 are coupled to adder 3105, as shown in FIG. 31. An output of adder 3105 provides an input to internal state 3106, as shown in FIG. 31. In one embodiment, each of internal state 3104 and 3106 includes a memory element, for example, a register, flip-flop, RAM, other memory elements, and any combination thereof. As shown in FIG. 31, the output of adder 3105 is connected to input of internal state 3106, and also to adder 3107. The output of internal state 3106 and the output of adder 3105 are coupled to adder 3107, as shown in FIG. 31. As shown in FIG. 31, at any instant of time an output 3108 ("y (n)") of single channel system 3100 depends on input 3101 and internal states 3104 and 3106. Design 3100 of the system has one input 3101 (X) and one output 3108 (Y). At each sample clock cycle, the system 3100 feeds the value present at the input X to a cascade of two identical finite response filters, and outputs the result Y, as shown in FIG. 31.

Figure 32A:
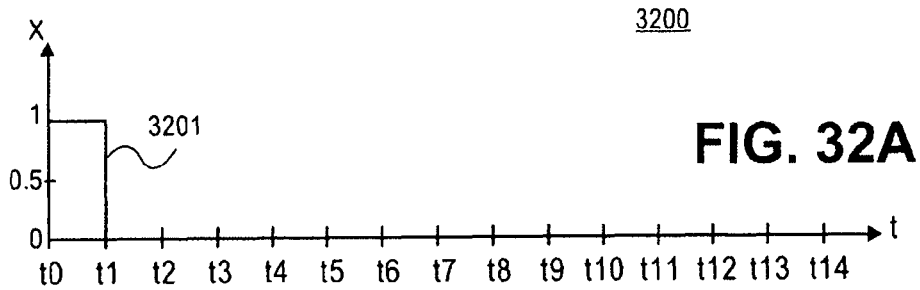
FIGS. 32A-32F illustrate of signals versus time that are generated at various blocks of design 3100 of FIG. 31 according to one embodiment of the invention.
Figure 32B:
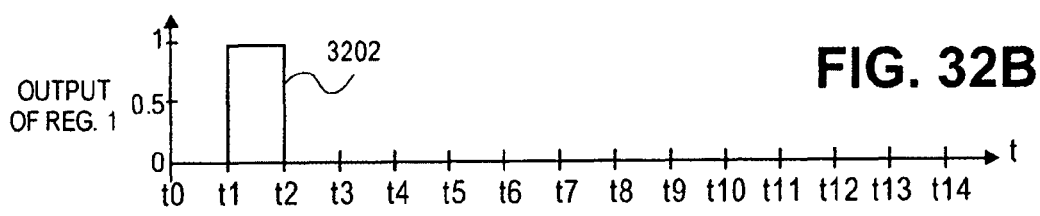
Figure 32C:
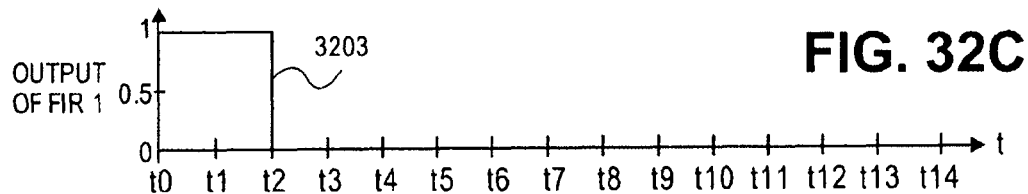
Figure 32D:
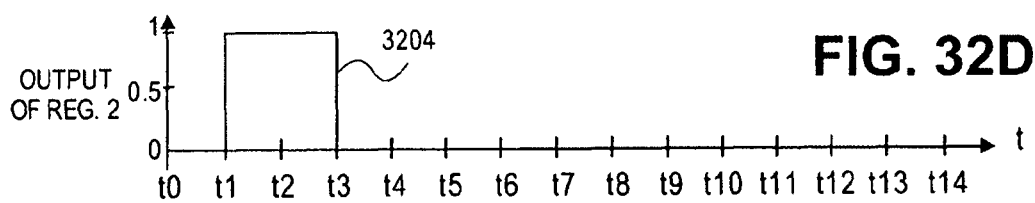
Figure 32E:
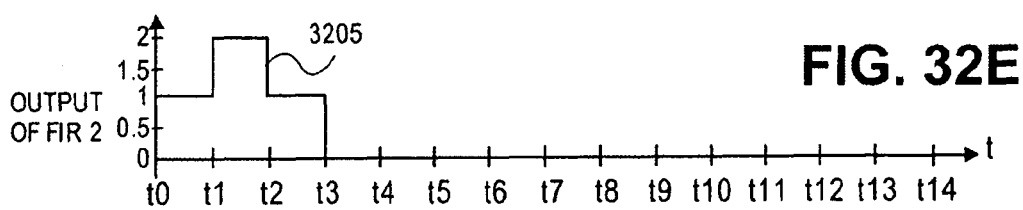
Figure 32F:
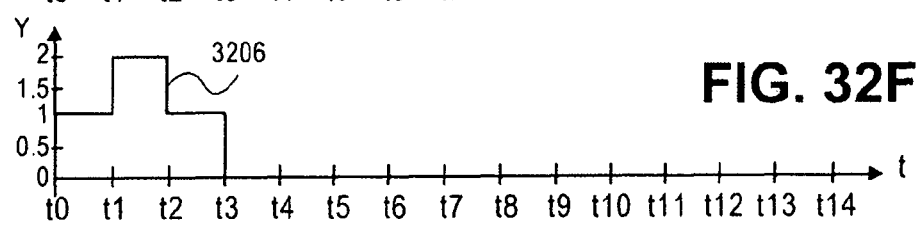

FIGS. 32A-32F illustrate one embodiment of signals versus time that are generated at various blocks of design 3100 of FIG. 31. FIG. 32A illustrates one embodiment of a signal 3201 provided by an input 3101. As shown in FIG. 32A, from t0 to t1 input signal 3201 has amplitude 1. FIG. 32B illustrates one embodiment of a signal 3202 at the output of element 3104. As shown in FIG. 32B, signal 3202 is a one clock cycle delayed input signal 3201. FIG. 32C illustrates one embodiment of a signal 3203 at the output of instance 3102 e.g., FIR1). As shown in FIG. 32C, FIR1 outputs signal 3203 that results from adding signal 3201 and signal 3202 by adder 3105. As shown in FIG. 32C, signal 3203 has amplitude 1 from t0 to t2. FIG. 32D illustrates one embodiment of a signal 3204 at the output of internal state 3106. As shown in FIG. 32D, signal 3204 is a one clock cycle delayed signal 3203. FIG. 32E illustrates one embodiment of a signal 3205 at the output of instance 3103 (e.g., FIR2). As shown in FIG. 32E, signal 3205 is a result of adding signal 3204 to signal 3203 by adder 3107. FIG. 32F illustrates one embodiment of a signal 3206 at the output 3108. As shown in FIG. 32F, signal 3206 is identical to signal 3205.

Figure 33:
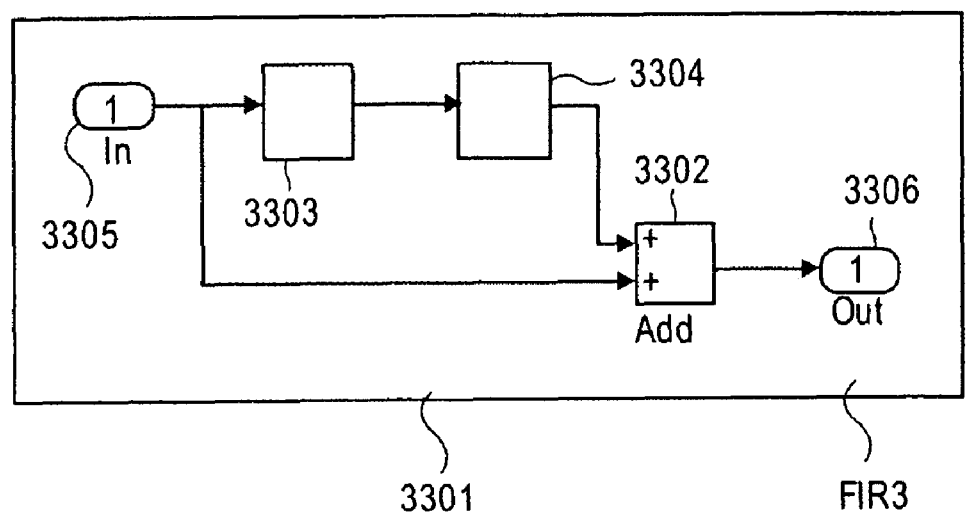
FIG. 33 shows one embodiment of a time-shared instance of a FIR logical block.

FIG. 33 shows one embodiment of a time-shared instance of FIR logical block. As shown in FIG. 33, a time-shared instance 3301 (e.g., FIR 3) has elements 3303 and 3304 that are used to time multiplex internal states 3104 and 3106 of FIG. 31. In one embodiment, elements 3303 and 3304 are memory elements, e.g., registers, flip-flops, RAM, other memory elements, and any combinations thereof. In one embodiment, elements 3303 and 3304 are shifting sequential register elements coupled to each other in a cascade. In one embodiment, elements 3303 and 3304 include a cascade of multiple shifting sequential register elements. In one embodiment, e.g., when element 3303 and element 3304 include a dual-port RAM, element 3303 is mapped to internal state 3104, and element 3304 mapped to internal state 3106. In another embodiment, e.g., when element 3303 and element 3304 include a dual-port RAM, element 3303 is mapped to internal state 3106, and element 3304 is mapped to internal state 3104. Element 3303 is coupled between an input 3305 and element 3304, as shown in FIG. 33. An output of element 3304 and input 3305 are coupled to adder 3302. An output of adder 3302 is coupled to output 3306 of instance 3301, as shown in FIG. 33.

Figure 34:
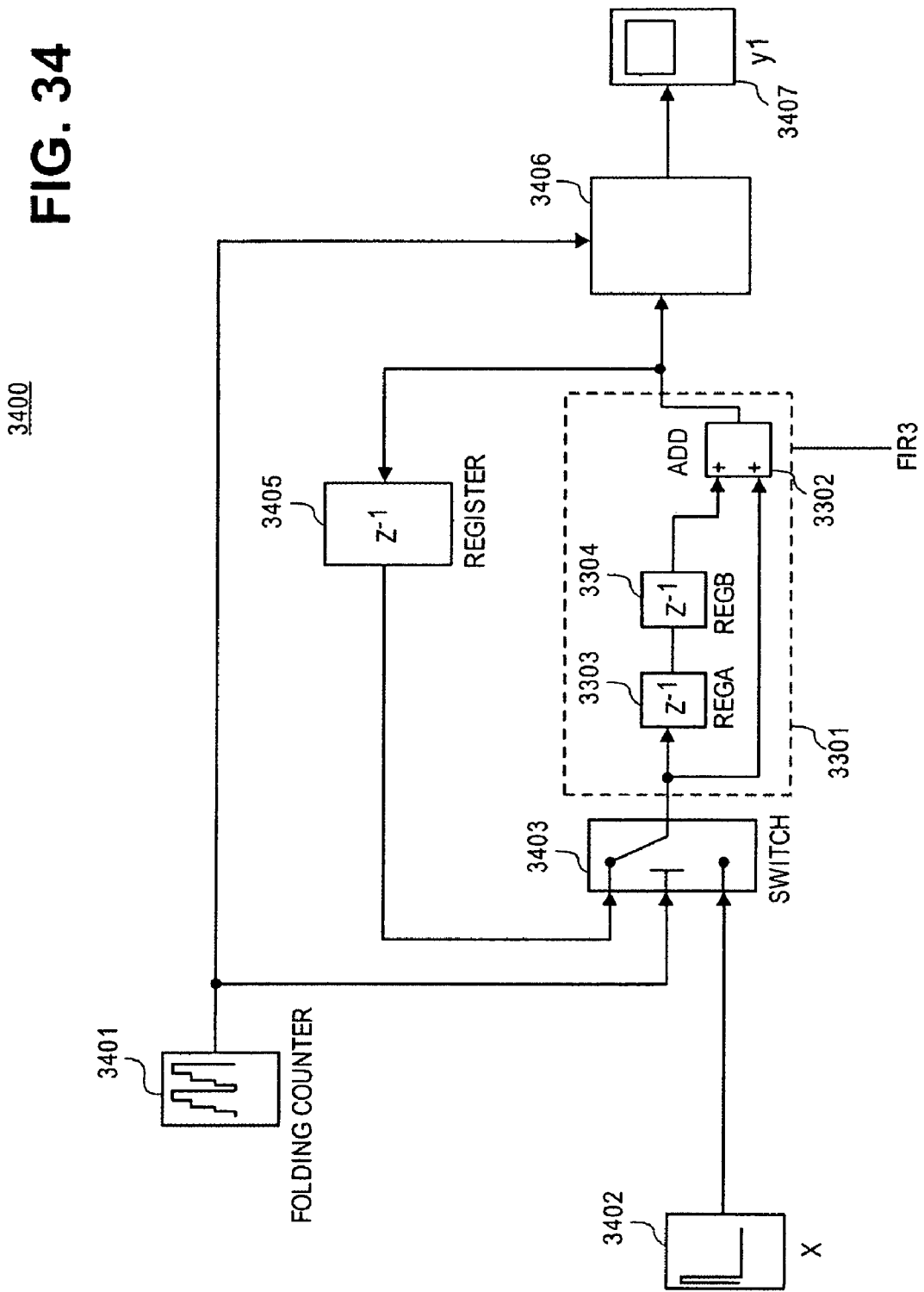
FIG. 34 shows one embodiment of a design of a single channel DSP system that has a time-shared instance of the FIR logical block.

FIG. 34 shows one embodiment of a design of a single channel DSP system that has a time-shared instance of the logical block (e.g., FIR, and IIR). As shown in FIG. 34, a plurality of instances 3102 and 3103 of first design 3100 are replaced with time-shared instance 3301 having elements 3303 and 3304 to time multiplex internal states 3104 and 3106. As shown in FIG. 34, design 3400 of the system has switch 3403. As shown in FIG. 34, operations performed by instances 3102 (e.g., FIR1) and 3103 (e.g., FIR2) are time multiplexed using switch 3403 that is coupled to a single instance 3301 (e.g., FIR3). Switch 3403 is controlled by a signal from a folding counter 3401.

Figure 35A:
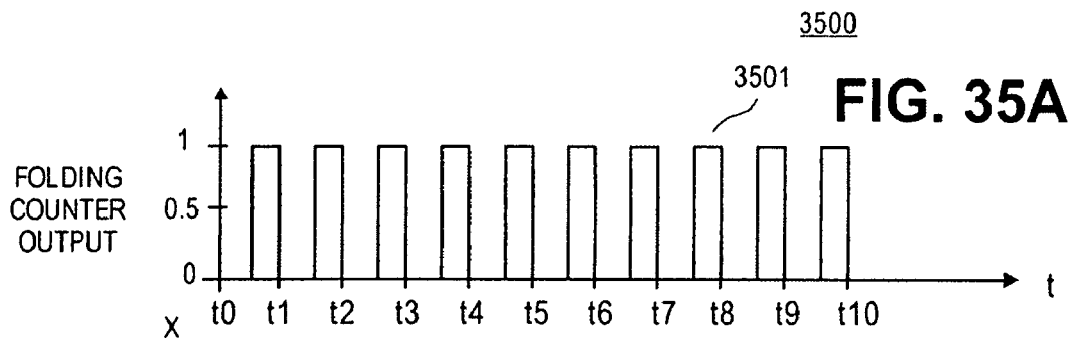
FIGS. 35A-35F illustrate signals versus time that are generated at various blocks of design 3400 of FIG. 34 according to one embodiment of the invention.
Figure 35B:
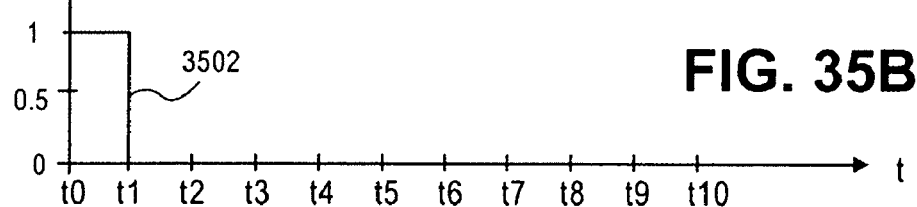

FIGS. 35A-35F illustrate one embodiment of signals versus time that are generated at various blocks of design 3400 of FIG. 34. FIG. 35A illustrates one embodiment of an output signal 3501 produced by folding counter 3401 versus time. As shown in FIGS. 35A-35F, each cycle of the clock 1 that drives the design 3100 of FIG. 31 has the duration from t0-t1, t1-t2, t2-t3, t3-t4, t4-t5, and the like. Folding counter 3401 produces 0 during a first half of clock 1, as shown in FIG. 35A. Folding counter 3401 produces 1 during a second half of clock 1, as shown in FIG. 35A. FIG. 35B illustrates one embodiment of a signal 3502 provided by an input 3402. As shown in FIG. 35B, from t0 to t1 input signal 3502 has amplitude 1.

Referring back to FIG. 34, instance 3301 performs operation FIR 3 based on signal 3501 from folding counter 3401. In one embodiment, when folding counter 3401 outputs 0 that corresponds to the first half of each sample clock of clock 1, switch 3403 connect input 3402 to instance 3301 (e.g., FIR3), so that instance 3301 receives input signal 3502. The result of operation of instance 3301 (e.g., FIR3) may be stored in register 3405, as shown in FIG. 34. When folding counter 3401 outputs 1 that corresponds to the second half of each sample clock of clock 1, switch 3403 connects output from register 3405 to instance 3301, so that instance 3301 receives the result of its operation (e.g., FIR3) stored in register 3405.

Figure 35C:
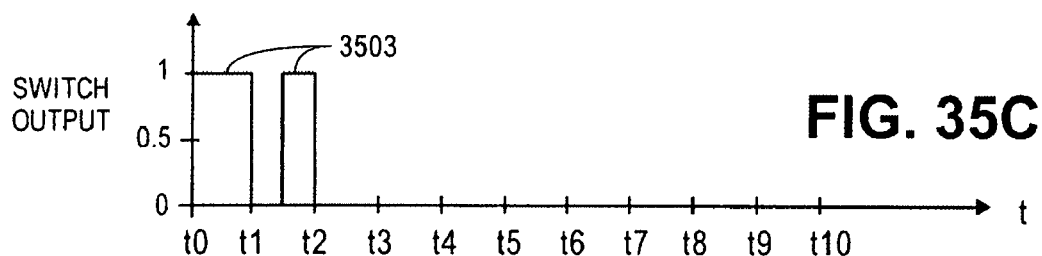

FIG. 35C illustrates one embodiment of a signal present at output of switch 3403. As shown in FIG. 35C, a signal 3503 at the output of switch 3403 is a time-multiplexed combination of input 3502 and an output of FIR3 (not shown) that may be stored in register 3405. As shown in FIG. 35C, signal 3503 has amplitude 1 from t0 to t1 that represents input signal 3502, from t1 to t1.5 is has amplitude 0, and from t1.5 to t2 has amplitude 1 that represents a result of operation performed by FIR3 that may be stored in register 3405.

Referring back to FIG. 34, switch 3403 outputs a time-multiplexed combination of signals X and the result of FIR3 operation to the input of time-shared instance 3301. The time multiplexed combination of input signal X and the result of FIR3 operation are provided to element 3303 ("register A") and adder 3302. In one embodiment, elements 3303 and 3304 take turns to hold the internal states 3104 and 3106 of design 3100. For example, when switch 3403 is in state 21+0, element 3304 holds the value of internal state 3104 at 1'th sample. This value can be considered as the input to FIR1 operation delayed by one sample clock. A first channel of a multi-channelized version of FIR 3 may be used for FIR1 operation. Further, during state 21+0, element 3303 holds the value of internal state 3106 at 1'th sample. This value can be considered as the input to FIR2 operation delayed by a half sample clock. A second channel of multi-channelized version of FIR3 may be used for FIR 2 operation. Further, when switch 3403 is in state 21+1, element 3304 holds the value of internal state 3106 at 1'th sample. This value can be considered as the input to FIR2 operation delayed by one sample clock. A second channel of a multi-channelized version of FIR 3 may be used for FIR 2 operation. Further, during state 21+1, element 3303 holds the value of internal state 3104 at 1+1'th sample. This value can be considered as the input to FIR1 operation delayed by a half sample clock. A first channel of a multi-channelized version of FIR 3 may be used for FIR 1 operation. The output signal from element 3303 is provided to the input of element 3304, as shown in FIG. 34.

Figure 35D:
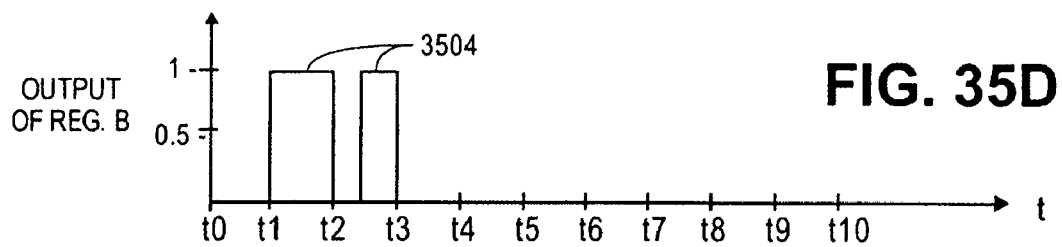

FIG. 35D illustrates one embodiment of output signal 3504 from element 3304. As shown in FIG. 35D, the output of element 3304 is delayed by one clock period relative to the output signal 3503. That is, signal 3504 is one sample clock cycle delayed time-multiplexed combination of input signal 3502 and the result of FIR3 operation. Referring back to FIG. 34, output signal 3504 from element 3304 ("register B") and time-multiplexed output signal 3503 from switch 3403 are fed to adder 3302.

Figure 35E:
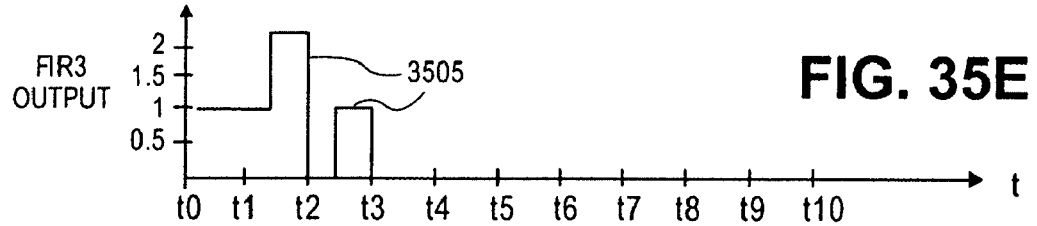

FIG. 35E illustrates one embodiment of an output signal 3505 from adder 3302 of FIR3. As shown in FIG. 35E, adder adds the output signal 3503 from switch 3403 to the output signal 3504 from element 3304 ("register B") to produce a sum signal 3505. As shown in FIG. 35E, from t0 to t 1.5 signal 3505 has amplitude 1, from t1.5 to t2 signal 3505 has amplitude 2, from t2 to t2.5 signal 3505 has amplitude 0, and from t2.5 to t3 signal 3505 has amplitude 1. That is, logical block FIR3 of design 3400 replaces a sequence of operations FIR1 and FIR2 of design 3000 of FIG. 30.

Referring back to FIG. 34, the output of instance 3301 is coupled to latch 3406. Latch 3004 latches ("picks") signals from FIR 3 based on signal 3501 from folding counter 3401, as shown in FIG. 34. The latched signal from operation of FIR3 is output to display 3407, as shown in FIG. 34.

Figure 35F:
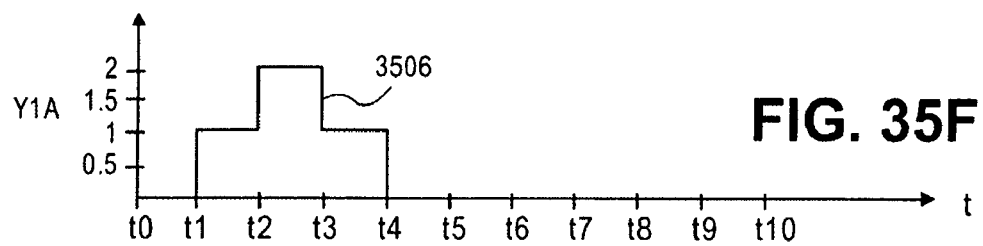

FIG. 35F illustrates one embodiment of a latched signal 3506 displayed on display 3407. As shown in FIG. 35F, latched signal 3506 from FIR3 is delayed by one clock cycle relative to signal 3505. As shown in FIG. 35F, from t1 to t2 signal 3506 has amplitude 1, from t2 to t3 signal 3506 has amplitude is 2, and from t3 to t4 signal 3506 has amplitude 1. In one embodiment, shape of signal 3506 may be determined mathematically as follows. For example, output of FIR1 operation at sample index n may be denoted as z(n) and may be expressed in terms of FIR1 input x(n) as follows:

$$z(n)=x(n)+x(n-1) \qquad \text{Equation (1)}$$

Output of FIR2 operation at sample instance index n may be denoted as y(n) and may be expressed in terms of the FIR2 input z(n) as follows:

$$y(n)=z(n)+z(n-1) \qquad \text{Equation (2)}$$

Using Equation (1) to expand z(n) and z(n−1) in Equation (2):

$$y(n)=[x(n)+x(n-1)+x(n-2)]$$

$$y(n)=x(n)+2x(n-1)+x(n-2) \quad \text{Equation (3)}$$

Now, if for example, x(0)=1, and x(i)=0 for i≠0. Then, inserting these values into Equation (3) results in the following:

$$y(0)=1,$$

$$y(1)=2,$$

$$y(2)=1,$$

$$y(i)=0 \text{ for } i>2$$

These values correspond to signal 3206 at the output of design 3100 and to signal 3506 at the output of design 3400. As shown in FIG. 35F, signal 3506 has one sample latency relative to signal 3206.

Figure 37:
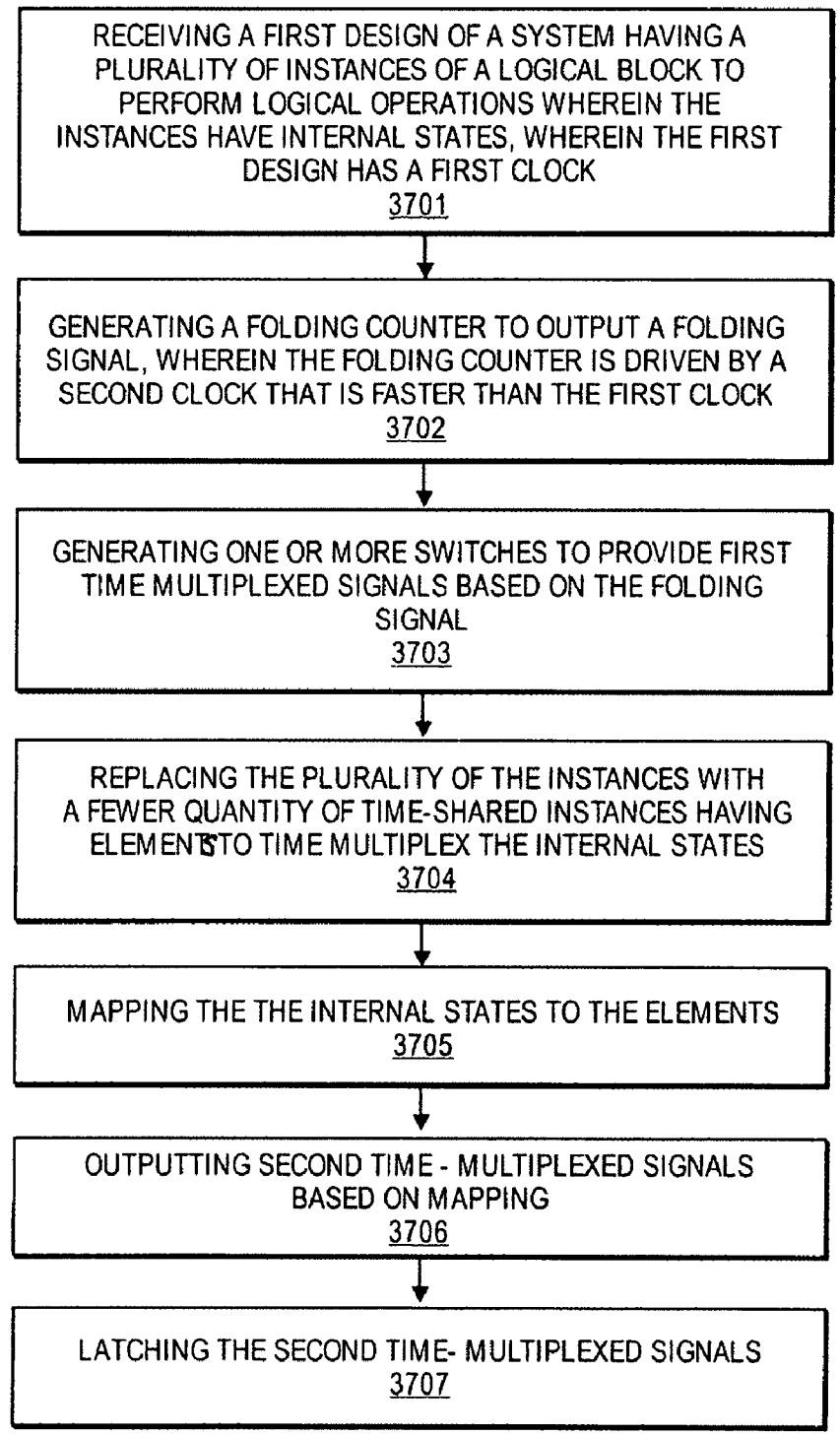
FIG. 37 shows a flowchart of another embodiment of a method to automatically perform folding of a digital processing system having a logical block with an internal state.

FIG. 37 shows a flowchart of one embodiment of a method to automatically perform folding of a digital system having a logical block with an internal state. Method 3700 begins with operation 3701 that involves receiving a first design of a system having a plurality of instances of a logical block (e.g., MAC, FIR) to perform logical operations. The instances have internal states, as described above with respect to FIGS. 26-36. Next, method 3700 continues with operation 3602 that involves generating a folding counter to output a folding signal, wherein the folding counter is driven by a second clock that is faster than the first clock, as described above with respect to FIGS. 30, 34, and 35. Next, method 3700 continues with operation 3703 that involves generating one or more switches to provide first time multiplexed signals based on the folding signal, as described above with respect to FIGS. 29-30, and 34-35. Further, operation 3704 that involves replacing the plurality of the instances with a fewer quantity of time-shared second instances having elements to time multiplex the internal states is performed, as described above with respect to FIGS. 26-36. Next, operation 3705 that involves mapping the elements to the internal states may be performed, for example, as described above with respect to FIGS. 29 and 34. In one embodiment, the registers and RAMs may be mapped the same way as in a multi-channelization algorithm described above.

Figure 38A:
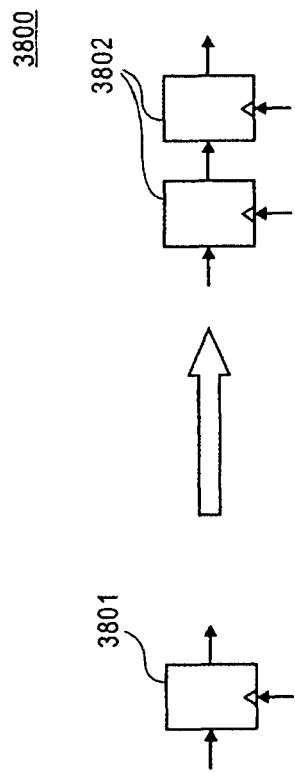
FIG. 38A illustrate one embodiment of mapping of internal states of a logical block in a first design to elements of a time-shared logical block in a second design.

FIG. 38A illustrate one embodiment of mapping of internal states of logical block in a first design (e.g., designs 2700 and 3100) to elements of a time-shared logical block in a second design (e.g., designs 2900, 3000, and 3400). As shown in FIG. 38A, an internal state register 3801 in a logical block of a first design becomes a shift-register 3802 in a time-shared logical block of a second design.

Figure 38B:
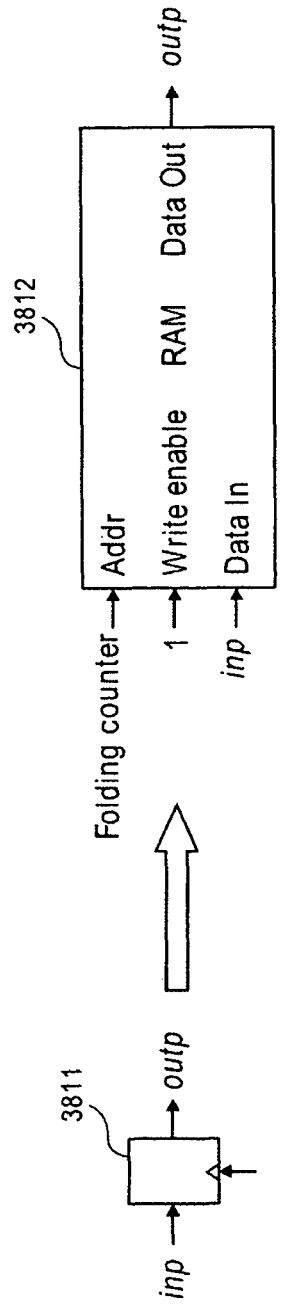
FIG. 38B illustrate another embodiment of mapping of internal states of a logical block in a first design to elements of a time-shared logical block in a second design.

FIG. 38B illustrate another embodiment of mapping of internal states of logical block in a first design (e.g., designs 2700 and 3100) to elements of a time-shared logical block in a second design (e.g., designs 2900, 3000, and 3400). As shown in FIG. 38B, an internal state register 3811 in a logical block of a first design becomes a read-first RAM 3812 having a depth, e.g., depth 2, in a time-shared logical block of a second design.

In one embodiment, RAM 3812 is always write-enabled, and during each write access, it reads the original content of the addressed RAM location before writing the new value.

Further, operation 3706 that involves outputting second time-multiplexed signals is performed. The second time-multiplexed signals may be output based on mapping. Next, operation 3707 that involves latching of the second time-multiplexed signals is performed, as described above with respect to FIGS. 30, 34, and 35.

It is appreciated that methods described above with respect to FIGS. 26-38 to time-share sequential components can be added without any restrictions to any known methodology to time-share combinational blocks. For example, sequential components (e.g., with internal states) and combinational components (e.g., without internal states) may be time-shared using methods described above.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to design a system, the method comprising:
   receiving a first design of a system having a plurality of first instances of a logical block to perform logical operations, wherein the first instances have internal states; and
   automatically, through a processor, generating a second design for the system having a time-shared instance of the logical block, wherein the time-shared instance replaces the plurality of the first instances of the logical block in the first design, wherein the time-shared instance has first elements configured to time multiplex operations associated with the internal states of the first instances.

2. The method of claim 1, wherein the automatically transforming further includes mapping the first elements to the internal states.

3. The method of claim 1, wherein the first elements include memory elements.

4. The method of claim 1, wherein the first elements include a cascade of multiple shifting sequential elements.

5. The method of claim 1, wherein an internal state of the plurality of the first instances includes a memory element.

6. The method of claim 1, wherein an output of the logical block depends on an internal state.

7. The method of claim 1, wherein the system has a single channel.

8. The method of claim 1, wherein the automatically transforming further includes
   generating a folding counter to output a folding signal; and
   generating one or more switches to provide time-multiplexed signals based on the folding signal.

9. The method of claim 1, wherein the first instances are coupled sequentially.

10. The method of claim 1, wherein the logic block includes a finite impulse response filter.

11. The method of claim 1, wherein the logic block includes a multiply and accumulate operator.

12. The method of claim 1, wherein the first design of the system further includes one or more instances of another logical block without an internal state.

13. A machine-readable medium storing data that, when accessed by a digital processing system, cause the system to perform operations, comprising:
   receiving a first design of a system having a plurality of first instances of a logical block to perform logical operations, wherein the first instances have internal states; and
   automatically, through a processor, generating a second design for the system having a time-shared instance of the logical block, wherein the time-shared instance replaces the plurality of the first instances of the logical block in the first design, wherein the time-shared instance has first elements configured to time multiplex operations associated with the internal states of the first instances.

14. The machine-readable medium of claim 13, wherein the automatically transforming further includes mapping the first elements to the internal states.

15. The machine-readable medium of claim 13, wherein the first elements include memory elements.

16. The machine-readable medium of claim 13, wherein the first elements include a cascade of multiple shifting sequential elements.

17. The machine-readable medium of claim 13, wherein an internal state of the plurality of the first instances includes a memory element.

18. The machine-readable medium of claim 13, wherein an output of the logical block depends on an internal state.

19. The machine-readable medium of claim 13, wherein the system has a single channel.

20. The machine-readable medium of claim 13, wherein the automatically transforming further includes
generating a folding counter to output a folding signal; and
generating one or more switches to provide time-multiplexed signals based on the folding signal.

21. The machine-readable medium of claim 13, wherein the first instances are coupled sequentially.

22. The machine-readable medium of claim 13, wherein the logic block includes a finite impulse response filter.

23. The machine-readable medium of claim 13, wherein the logic block includes a multiply and accumulate operator.

24. The machine-readable medium of claim 13, wherein the first design of the system further includes one or more instances of another logical block without an internal state.

25. A digital processing system, comprising:
means for receiving a first design of a system having a plurality of first instances of a logical block to perform logical operations, wherein the first instances have internal states; and
means for automatically, generating a second design for the system having a time-shared instance of the logical block, wherein the time-shared instance replaces the plurality of the first instances of the logical block in the first design, wherein the means for automatically generating includes a processor, wherein the time-shared instance has first elements configured to time multiplex the operations associated with internal states of the first instances.

26. The system of claim 25, wherein the means for automatically transforming further includes mapping the first elements to the internal states.

27. The system of claim 25, wherein the first elements include memory elements.

28. The system of claim 25, wherein the first elements include a cascade of multiple shifting sequential elements.

29. The system of claim 25, wherein an internal state of the plurality of the first instances includes a memory element.

30. The system of claim 25, wherein an output of the logical block depends on an internal state.

31. The system of claim 25, wherein the system has a single channel.

32. The system of claim 25, wherein the means for automatically transforming further includes
means for generating a folding counter to output a folding signal; and
means for generating one or more switches to provide time-multiplexed signals based on the folding signal.

33. The system of claim 25, wherein the first instances are coupled sequentially.

34. The system of claim 25, wherein the logic block includes a finite impulse response filter.

35. The system of claim 25, wherein the logic block includes a multiply and accumulate operator.

* * * * *